United States Patent
Tomaru et al.

[11] Patent Number: 6,066,984
[45] Date of Patent: May 23, 2000

[54] AMPLIFIER AND AMPLIFYING METHOD FOR AMPLIFYING A PLURALITY OF SIGNALS HAVING DIFFERENT BANDS SIMULTANEOUSLY

[75] Inventors: Fumihito Tomaru, Higashikurume; Norio Hikasa, Kodaira, both of Japan

[73] Assignee: Hitachi Denshi Kabushiki Kaisha, Tokyo, Japan

[21] Appl. No.: 09/267,446

[22] Filed: Mar. 12, 1999

[30] Foreign Application Priority Data

Mar. 16, 1998 [JP] Japan .................................. 10-065066
Mar. 16, 1998 [JP] Japan .................................. 10-065067

[51] Int. Cl.$^7$ ............................. H03F 1/26; H03F 3/68; H03F 1/00; H04K 1/02
[52] U.S. Cl. ........................ 330/149; 330/126; 330/151; 375/296
[58] Field of Search ............................ 330/52, 126, 149, 330/151; 375/296, 297

[56] References Cited

U.S. PATENT DOCUMENTS

| | | | |
|---|---|---|---|
| 5,424,680 | 6/1995 | Nazarathy et al. | 330/149 |
| 5,691,668 | 11/1997 | Yoshikawa et al. | 330/52 |
| 5,854,811 | 12/1998 | Sasaki | 375/296 |

*Primary Examiner*—Robert Pascal
*Assistant Examiner*—Patricia T. Nguyen
*Attorney, Agent, or Firm*—Antonelli, Terry, Stout & Kraus, LLP

[57] ABSTRACT

An amplifier includes an amplifying section for simultaneously amplifying a plurality of input signals having different frequency bands, a distortion extracting section for separating and extracting at every different frequency bands a distortion component from a plurality of signals having the different frequency bands outputted from the amplifying section, a distortion compensation section for adjusting independently at every different frequency bands the phase and the amplitude of the distortion component separated and extracted at every different frequency bands and a distortion eliminating section for canceling and outputting a distortion component from a plurality of signals having the different frequency bands outputted from the amplifying section based on the distortion component adjusted at every different frequency bands. The above distortion compensation section adjusts independently at every different frequency bands the phase and the amplitude of the distortion component separated and extracted at every different frequency bands in such a manner that the above-mentioned phase and amplitude agree with the phases and the amplitudes of the distortion components contained in a plurality of signals having the different frequency bands outputted from the amplifying section.

14 Claims, 14 Drawing Sheets

AMPLIFIER AND AMPLIFYING METHOD FOR AMPLIFYING A PLURALITY OF SIGNALS HAVING DIFFERENT BANDS SIMULTANEOUSLY

BACKGROUND OF THE INVENTION

The present invention relates to an amplifier and an amplifying method for simultaneously amplifying a plurality of signals having different bands. An amplifier is able to simultaneously amplify a plurality of signals having different bands. This amplifier having a linearizer is described in "Extremely low-distortion multi-carrier amplifier for mobile communication systems", IEICE (the Institute of Electronics, Information and Communication Engineers) Technical Report, RCS90-4, May 24, 1990, for example.

FIG. 1 of the accompanying drawings is a block diagram used to explain an example of such a conventional amplifier, i.e. amplifier having a linearizer. That is, FIG. 1 is a block diagram showing a feed-forward system (hereinafter referred to simply as an F/F system) amplifier for use in a digital modulation system, i.e. linear modulation system such as QAM (Quadrature Amplitude Modulation). In FIG. 1, reference numeral 1 denotes an input terminal, 24 a pilot signal generating section, 25 an adder, 2 a first directional coupler (first distributor or branching filter), 3 a first vector controller, 4 an amplifying section (PA), 5 a second directional coupler (second distributor or branching filter), 9 a first delay element, 10 a subtracter, 12 an attenuator, 27 a third directional coupler (third distributor or branching filter), 15 a second vector controller, 18 an error amplifier, 6 a second delay element, 7 a fourth directional coupler (fourth synthesizer or coupler), 28 a main signal controller, 29 an error signal controller, 26 a fifth directional coupler (first synthesizer or coupler), 30 a bandpass filter (BPF), and 19 an output terminal.

As shown in FIG. 1, a modulation signal is inputted from an input terminal 1. The modulation signal inputted from the input terminal 1 is inputted to the adder 25 through the first directional coupler 2. The first directional coupler 2 branches the inputted signal into two routes. One branched signal is inputted through the first vector controller 3 to the amplifying section 4. The other branched signal is inputted through the first delay element 9 to a subtracted input terminal of the subtracter 10. The signal outputted from the amplifying section 4 is supplied to the second directional coupler 5 and is branched by the second directional coupler 5 into two routes. One branched signal is supplied through the second delay element 6 to the fourth directional coupler 7. The other branched signal is inputted through the attenuator (ATT) 12 to a subtracting input terminal of the subtracter 10. The attenuator 12 matches the level of the inputted signal component with the signal level of the other signal inputted through the first delay element 9 to the subtracter 10 by attenuating the level of the inputted signal component. The first delay element 9 delays the phase of the inputted signal component by the same delay amount as that of the other signal inputted to the subtracter 10 through the attenuator 12.

Although the signal inputted to the amplifying section 4 is amplified to a predetermined output signal level necessary for transmission, the above-mentioned output signal contains an undesired distortion component generated due to a non-linearity of the amplifying section 4 except the necessary main signal. The subtracter 10 calculates a difference between the two inputted signals and extracts this distortion component. At that time, the first vector adjustment section 3 matches the output level (amplitude) and phase of the first delay element 9 to the signal level and phase of the main signal inputted to the subtracting input terminal of the subtracter 10 by adjusting the amplitude and phase of the inputted signal.

This distortion component outputted from the subtracter 10 is inputted through the second vector adjustment section 15, the error amplifier 18 and the third directional coupler 27 to the fourth directional coupler 7.

This distortion component becomes a signal which has a phase opposite to that of the signal inputted to the fourth directional coupler 7 through the second delay element 6. The fourth directional coupler 7 synthesizes the two inputted signals to cancel the distortion components out with respect to each other, thereby resulting in the linearization being effected. The output signal from the fourth directional coupler 7 is supplied through a fifth directional coupler 26 to a bandpass filter (BPF) 30, and an undesired component is eliminated from this output signal by the bandpass filter 30 and a resultant signal is outputted from the output terminal 19. A signal line from the input terminal 1, the first directional coupler 2, the first vector adjustment section 3, the amplifying section 4, the second directional coupler 5, the second delay element 6, the fourth directional coupler 7 to the output terminal 19 in FIG. 1 will hereinafter be referred to as a main signal transmission section. Also, other circuit portions than the main signal transmission section will be referred to as a distortion compensation section.

An example of an adjustment method for eliminating a distortion component in FIG. 1 will be described next.

One method will be described below. When a communication device such as a transmitter is activated, two non-modulated waves having close frequencies are inputted from the input terminal 1 as test signals, and the output from the subtracter 10 and the signal from the output terminal 19 are monitored. Then, according to this method, the vector adjustment section 3 and the vector adjustment section 15 are adjusted while these signals are being monitored. However, according to this method, the vector adjustment section 3 and the vector adjustment section 15 cannot be adjusted during the communication device is operated (during communication) so that this method cannot follow the characteristic change caused by a temperature fluctuation caused after data was transmitted in actual practice.

To solve the problem of the first method, there is proposed a second method in which a pilot signal is inserted near the transmission band at the input terminal side. This second method will hereinafter be described with reference to FIGS. 1 and 2.

FIG. 2 is a diagram showing a signal spectrum obtained after a pilot signal was inserted. In FIG. 2, a horizontal axis f represents a frequency, a vertical axis represents an electric power level, O.L. represents an output signal level, pit represents a pilot signal and D represents a distortion component.

Referring to FIG. 1, the pilot signal plt from the pilot signal generating section 24 is supplied to the adder 25, in which it is added to the signal from the first directional coupler 2. In FIG. 1, the third directional coupler 27 supplies the output signal of the amplifier 18 to the fourth directional coupler 7, and also branches a part of the above output signal and supplies the signal thus branched to the main signal controller (CONT1) 28. While monitoring the output signal from the subtracter 10, the main signal controller 28 adjusts the first vector adjustment section 3 in such a manner that the power of the monitored signal becomes minimum. Further, the fifth directional coupler 26 supplies the output signal of the third directional coupler 27 to the bandpass filter 30, and also branches a part of the output signal and supplies the signal thus branched to the error signal controller 29. While monitoring the output signal of the fifth directional coupler 26, the error signal controller 29 adjusts the second vector adjustment section 15 in such a manner that the pilot signal power plt of the monitored signal becomes minimum. In this manner, it is possible to eliminate the distortion component during the communication.

When the signals of the up-link (from the remote station to the master station) and the down-link (from the master station to the remote station) are simultaneously inputted and amplified like a link amplifier for use in a relation station for transmitting signals from the base station (master station) to the remote station or vice versa by using a plurality of frequency bands as described above, it is necessary to linearize over a very wide frequency band covering all of a plurality of different frequency bands.

SUMMARY OF THE INVENTION

However, when it is intended to obtain an improvement amount of more than 30 dB relative to a tertiary distortion, for example, if the amplified band exceeds 5% in the specific band, then it is difficult to widen the band of the phase-shifter for use in adjusting the vector. Therefore, a compensation of a constant amount cannot be effected over the whole band.

Moreover, the distortion characteristic of the amplifying section itself has the in-band deviation. For example, when it is intended to improve the tertiary distortion more than 30 dB, the in-band deviation between the frequency characteristic of the main signal transmission section and the frequency characteristic of the distortion compensation section for detecting and compensating the distortion should fall ±0.1 dB in amplitude and less than ±1 degree in phase. However, considering up to the characteristic of the error amplifier, it is difficult to simultaneously effect the optimum compensation on the signals of the up-link and the down-link, respectively.

As mentioned above, when the signals of a plurality of frequency bands are amplified simultaneously, the linearization should be effected over the very wide frequency band covering all of a plurality of carrier-frequency bands. However, since it is difficult to widen the band of the phase-shifter for use in adjusting the vector, the compensation of the constant amount cannot be effected over the whole band.

Also, due to the in-band deviation of the distortion characteristic of the amplifier itself, it is difficult to simultaneously effect the optimum compensation on the respective signals of the up-link and the down-link.

Moreover, not only in the amplifier in which a plurality of signals having different bands transmitted through the up-link and the down-link are amplified simultaneously but also in a variety of conventional amplifiers in which a plurality of analog signals of digital signals having different bands are amplified simultaneously, it is difficult to effect the optimum compensation on the whole bands of these signals.

Therefore, it is an object of the present invention to provide an amplifier and an amplifying method in which the above-mentioned problems can be solved.

It is another object of the present invention to provide an amplifier and an amplifying method in which the optimum linearization may be effected on the signals of the respective bands in an amplifier and an amplifying method in which a plurality of signals having different bands are amplified simultaneously.

According to the present invention, in order to attain the above-mentioned objects, by way of example, the extracted distortion component is separated into a plurality of compensated frequency bands, and the distortion detection and the distortion compensation are effected at every one of the separated frequency bands.

According to an aspect of the present invention, there is provided an amplifier in which a plurality of input signals having different frequency bands are amplified simultaneously and which is comprised of an amplifying section for simultaneously amplifying a plurality of input signals having different frequency bands, a distortion extracting section for separating and extracting distortion components at every one of the different frequency bands from a plurality of signals having different frequency bands outputted from the amplifying section, a distortion compensation section for independently adjusting at every one of the different frequency bands phases and amplitudes of the distortion components separated and extracted at every one of the different frequency bands and a distortion elimination section for canceling the distortion component from a plurality of signals having the different frequency bands outputted from the amplifying section based on the distortion component adjusted at every one of the different frequency bands, wherein the distortion compensation section independently adjusts the phases and amplitudes of the distortion components separated and extracted at every one of the different frequency bands such that the above-mentioned phases and amplitudes may agree with the phases and amplitudes of the distortion component contained in a plurality of signals having different frequency bands outputted from the amplifying section.

Therefore, according to the present invention, when a plurality of frequency bands are commonly amplified by using an amplifier of a wide band, since the distortion amount is extracted by separating the distortion component at every band and the optimum linearization is effected on the respective bands, the compensation in the wide specific band becomes possible equivalently, and it becomes possible to realize a digital radio communication device which is high in efficiency and also high in transmission quality.

DESCRIPTION OF THE PREFERRED EMBODIMENTS

Embodiments according to the present invention will hereinafter be described in detail with reference to the accompanying drawings. The present invention may be applied to all types of power amplifiers and power amplifying methods in which a plurality of signals having different frequency bands are amplified simultaneously. Moreover, the signals to be amplified may be either analog signals or digital signals, and the signal transmission system may be applied to both of a wired transmission system and a radio transmission system. In any cases, the arrangements shown in the following embodiments may be applied directly.

Figure 1:
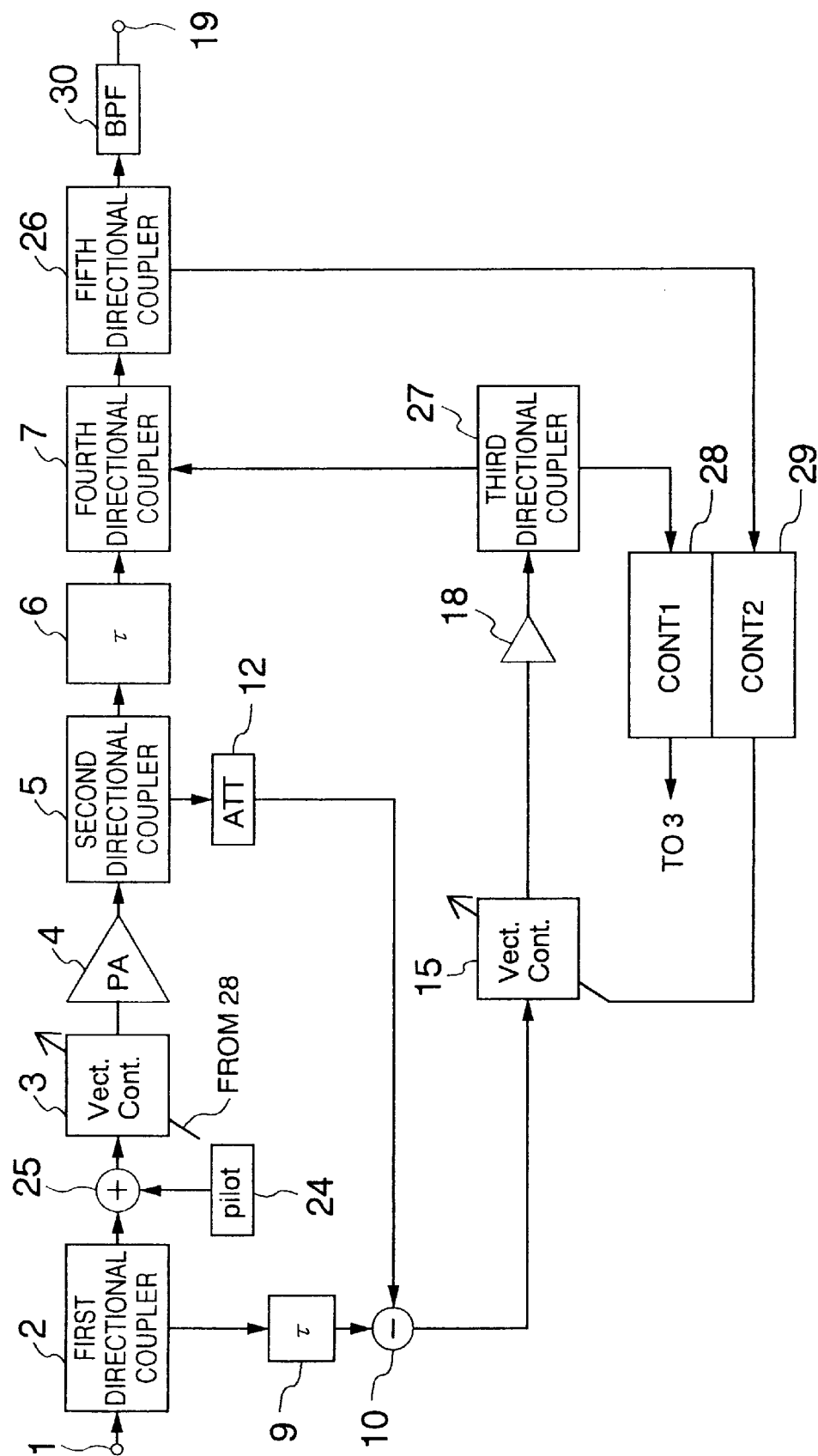
FIG. 1 is a block diagram showing an example of a conventional amplifier.

In the following embodiments, by way of example, similarly to the conventional example of FIG. 1, the present invention is applied to a power amplifier for simultaneously amplifying a plurality of digital signals having different frequency bands transmitted through an up-link and a down-link. More particularly, the present invention is applied to a feedforward-system power amplifier using a linear modulation system such as a QAM (Quadrature Amplitude Modulation) and QPSK (Quadrature Phase Shift Keying) as a digital modulation system.

In the following embodiments, elements and parts having the same functions are marked with the same reference numerals and therefore need not be described in detail.

Figure 3:
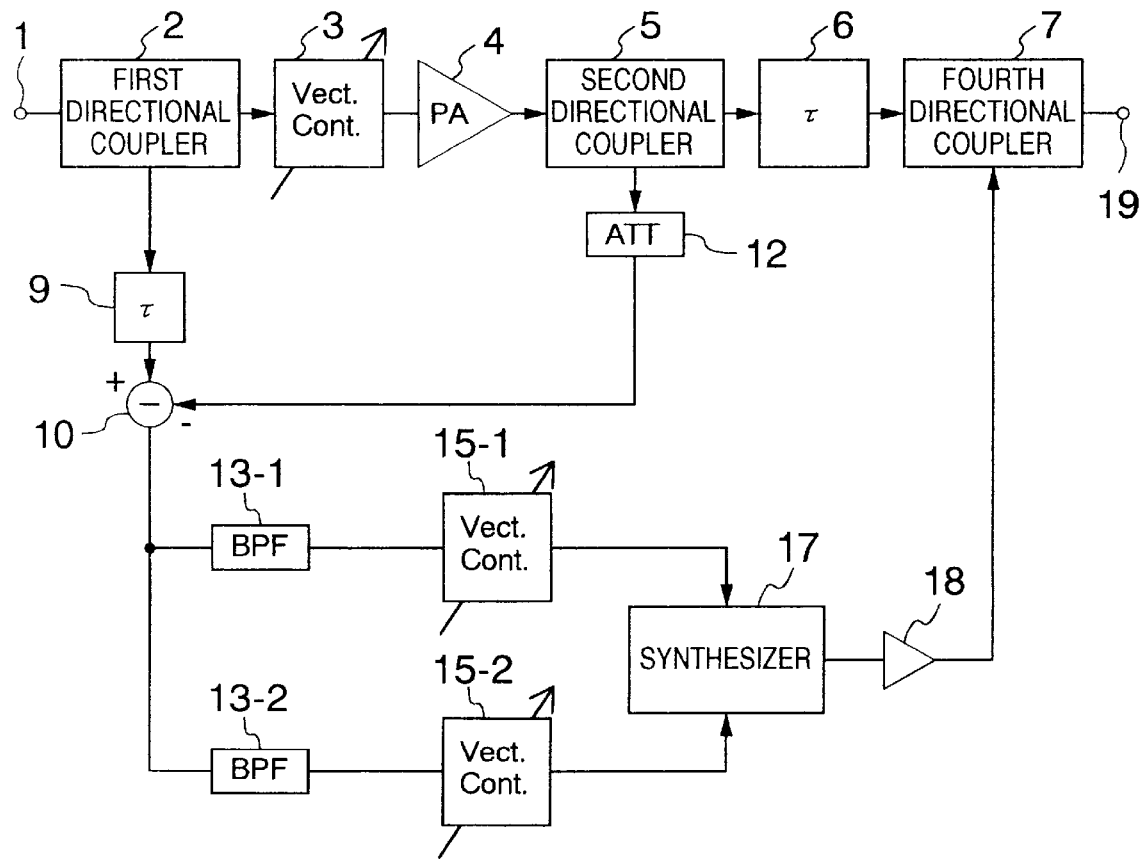
FIG. 3 is a block diagram showing a power amplifier according to a first embodiment of the present invention.

An embodiment of the present invention will hereinafter be described with reference to FIG. 3. FIG. 3 is a block diagram used to explain the first embodiment of the present invention. In FIG. 3, elements and parts having the same functions as those of the conventional example shown in FIG. 1 are marked with the same reference numerals and therefore need not be described. In FIG. 3, reference numerals 13-1, 13-2 depict bandpass filters and 15-1, 15-2 depict second vector control units, respectively. Reference numeral 17 depicts a directional coupler (synthesizer).

As shown in FIG. 3, the input terminal 1 is connected through the first directional coupler (branching filter) 2 to the first adjustment section 3 and the first delay element 9. The first vector adjustment section 3 is connected through the power amplifying section 4, the second directional coupler (branching filter) 5, the second delay element 6 and the fourth directional coupler (synthesizer) 7 to the output terminal 19. The first delay element 9 is connected to the subtracted input terminal of the subtracter 10. The subtracter 10 is connected through the bandpass filter 13-1 and the second vector control unit 15-1 to the directional coupler (synthesizer) 17. The directional coupler 17 is connected to the fourth directional coupler 7 through the error amplifier 18. Also, the second directional coupler 5 is connected to the subtracting input terminal of the subtracter 10 through the attenuator 12.

An operation of this power amplifier shown in FIG. 3 will be described below. As shown in FIG. 3, signals of the two carrier frequency bands of an up-link signal (center frequency thereof lies in the frequency band of 410 MHz, for example) and a down-link signal (center frequency thereof lies in the frequency band of 450 MHz, for example) are inputted to the input terminal 1 simultaneously. A plurality of signals inputted to the input terminal 1 are outputted from the input terminal 1 as one signal and then supplied to the first directional coupler 2. The first directional coupler 2 branches and outputs the signal thus inputted, and one of branched output signals is supplied through the first vector adjustment section 3 to the power amplifier 4. A signal processing operation of the main signal transmission section is similar to that of the conventional example shown in FIG. 1, and therefore need not be described. However, although the conventional power amplifier shown in FIG. 1 includes the fifth directional coupler 26 and the bandpass filter 30, they are omitted from the power amplifier according to the first embodiment shown in FIG. 3.

The other branched output signal is then supplied through the first delay element 9 to the subtracted input terminal of the subtracter 10 as a distortion compensation-system signal. An operation of the signal line up to the output of this subtracter 10 is the same as that of the conventional example shown in FIG. 1, and therefore need not be described. A distortion component is extracted from this subtracter 10.

The output signal from the subtracter 10 is supplied to the bandpass filter 13-1 and 13-2. The frequency characteristics of these bandpass filters 13-1 and 13-2 are set such that the up-link signal of the distortion component is extracted by the bandpass filter 13-1 and the down-link signal of the distortion component is extracted by the bandpass filter 13-2. Thus, the distortion component is separated into the up-link signal and the down-link signal. In the respective characteristics of the bandpass filters 13-1 and 13-2, since the level of the suppressed signal and the level of the passed signal are substantially equal to each other, it is sufficient that the attenuation amount of the attenuation region should be higher than 10 dB. Accordingly, the passbands WD1, WD2 of the bandpass filters 13-1 and 13-2 may be such one as those shown in FIG. 8, respectively.

The signals branched into the signals of the respective band of the up-link signal and the down-link signal are adjusted by the vector adjustment sections 15-1 and 15-2 in such a manner that they have the opposite phase/same level relative to the distortion component contained in the output from the delay element 6 when they are synthesized by the directional coupler 7 of the succeeding stage. The up-link signal and the down-link signal, respectively outputted from the aforementioned vector adjustment sections 15-1 and 15-2 are supplied to the synthesizer 17. The synthesizer 17 synthesizes the two distortion components and supplies the synthesized output signal to the error amplifier 18. The error amplifier 18 amplifies the inputted signal, and supplies the signal thus amplified to the directional coupler 7. The directional coupler 7 subtracts the distortion component by subtracting the signal of the distortion compensation section from the signal of the main signal transmission section, and outputs the subtracted output signal through the output terminal 19.

Figure 4:
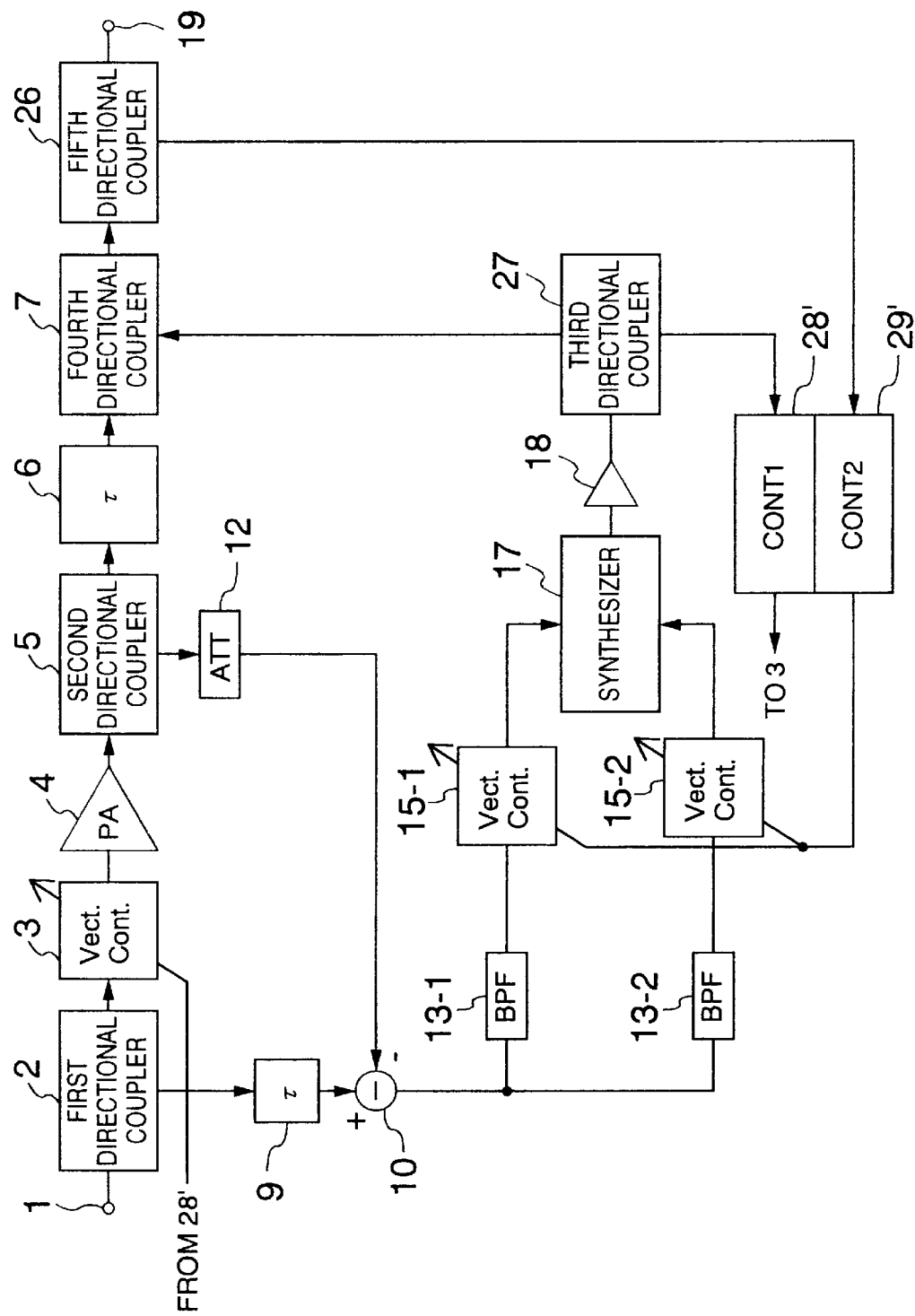
FIG. 4 is a block diagram showing a power amplifier according to a second embodiment of the present invention.

A second embodiment according to the present invention will be described next with reference to FIG. 4. FIG. 4 is a block diagram showing a power amplifier according to a second embodiment of the present invention in which the first embodiment shown in FIG. 3 is given the function to automatically and adaptively control the level adjustment sections 3, 15-1, 15-2. In FIG. 4, elements and parts having the same functions as those of FIG. 3 are marked with the same reference numerals. In FIG. 4, reference numeral 26 depicts a fifth directional coupler (branching filter), 27 a third directional coupler (branching filter), 28' a main signal controller, and 29' an error signal controller. The arrangement shown in FIG. 4 is substantially the same as that of FIG. 3 and includes the following elements and parts added thereto. Specifically, the third directional coupler 27 is provided in the signal line between the error amplifier 18 and the fourth directional coupler 7. The signal outputted from the error amplifier 18 is supplied through the third directional coupler 27 to the fourth directional couple 7. A part of the output signal is branched by the third directional coupler 27 and supplied to the main signal controller (CONT1) 28'. Further, the fifth directional coupler 26 is provided in the signal line between the fourth directional coupler 7 and the output terminal 19. The fifth directional coupler 26 supplies the output signal of the fourth directional coupler 7 to the output terminal 19, and also branches a part of the output signal and supplies the output signal thus branched to the error controller (CONT2) 29'.

An operation concerning the extraction/compensation of the distortion component in the second embodiment shown in FIG. 4 is the same as that of the first embodiment shown in FIG. 3. The manner in which the first vector adjustment section 3 comprising the main signal transmission section line and the second vector sections 15-1, 15-2 of the distortion compensation section line are controlled will be described with reference to FIG. 4.

Initially, in order to control the first vector adjustment section 3 of the main signal transmission section line, a part of the extracted distortion component is extracted from the third directional coupler 27. In the subtracter 10, if the levels and phases of the up-link signal (U.L.) and the down-link signal (D.L.) contained in the signal inputted from the attenuator 12 agree with those of the signal inputted from the first delay element 9, then the up-link signal (U.L.) and the down-link signal (D.L.) of the output signal from the subtracter 10 are suppressed, and only the distortion component is outputted. However, if the levels (amplitudes) and phases of the two up-link signal (U.L.) and the down-link signal (D.L.) inputted to the subtracter 10 are different from each other, then the up-link signal (U.L.) and the down-link signal (D.L.) of the output signal from the subtracter 10 are not suppressed sufficiently and left. Accordingly, if the level and phase of the output signal from the first vector adjustment section 3 are adjusted by the first vector adjustment section 3 in such a manner that the output electric power of the error amplifier 18 is minimized, then the up-link signal (U.L.) and the down-link signal (D.L.) of the output signal from the subtracter 10 are suppressed most. Therefore, while monitoring the signals of the bands of both the up-link signal (U.L.) and the down-link signal (D.L.), i.e. information indicative of the electric power level of the distortion component indicated by the output from the amplifier 18, the main signal control section 28' controls the first vector adjustment section 3 in such a manner that the electric power level is minimized.

Next, the fourth directional coupler 7 which outputs the signal whose distortion was compensated synthesizes the signal from the distortion compensation section line inputted from the third directional coupler 27 and the signal from the main signal transmission section line inputted from the second delay element 6. If these signals are accurately opposite in phase and the same in level, then the distortion components are completely cancel each other out at the output terminal of the fourth directional coupler 7 and a distortion component is not contained in the output. Accordingly, to this end, electric powers of the outside (out of band) of the respective bands of the up-link signal (U.L.) and the down-link signal (D.L.) at the output side of the fourth directional coupler 7, i.e. branched and outputted from the fifth directional coupler 26 may be detected by the error signal control section 29', and the second vector adjustment sections 15-1, 15-2 may be separately controlled in such a manner that its detected electric power may be minimized.

The arrangement and operation of the above-mentioned main signal control unit 28' (CONT1) will be described.

Figure 5:
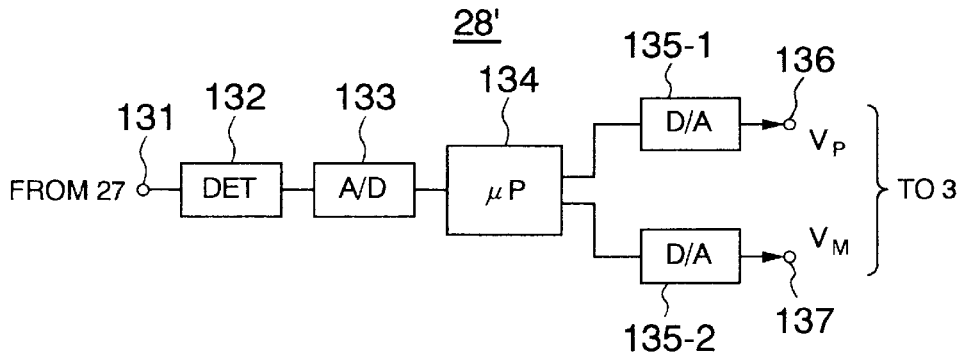
FIG. 5 is a block diagram showing an example of a main signal control section in the second embodiment shown in FIG. 4.

FIG. 5 is a block diagram showing an example of the main signal control section 28' (CONT1). Referring to FIG. 5, a signal branched from the directional coupler 27 is inputted to an error signal (distortion component) input terminal 131. This input terminal 131 is connected through a detector (DET) 132, an A/D (analog-to-digital) converter 133 and a microprocessor ($\mu$P) 134 to D/A (digital-to-analog) converters 135-1 and 135-2. The D/A converter 135-1 is connected to a phase-control voltage output terminal 136, and the D/A converter 135-2 is connected to an amplitude-control voltage output terminal 137. These output terminals 136, 137 are connected to the vector adjustment section 3.

An operation of the main signal control section 28' will be described below.

The error signal branched by the directional coupler 27 after it was inputted from the input terminal 131 is detected by the detector 132 and thereby converted into a baseband signal. This baseband signal is quantized by the A/D converter 133 and then supplied to the microprocessor 134. Based on the quantized signal, the microprocessor 134 obtains by computation a phase-control voltage value and an amplitude-control voltage value for use in controlling (i.e. minimizes the output electric power of the error amplifying section 8) the vector adjustment section 3 in such a manner that the output of the vector adjustment section 3 has the optimum phase and level relative to the distortion extraction, and supplies the thus computed phase-control voltage value and amplitude-control voltage value to the D/A converters 135-1 and 135-2. A phase-control voltage value $V_P$ and an amplitude-control voltage value $V_M$ from the D/A converters 135-1 and 135-2 are supplied through the output terminals 136, 137 to the vector adjustment section 3.

As the algorithm for obtaining the optimum values of the output phase and the output level of this vector adjustment section 3, there may be used any methods such as a perturbation method, a method of least squares and a method of steepest descent. Here, by way of example, with respect to the algorithm of the perturbation method, its example of processing will be described with reference to flowcharts of FIGS. 6A and 6B. The processing in the flowcharts of FIGS. 6A and 6B is executed by the microprocessor 134.

Figure 6A:
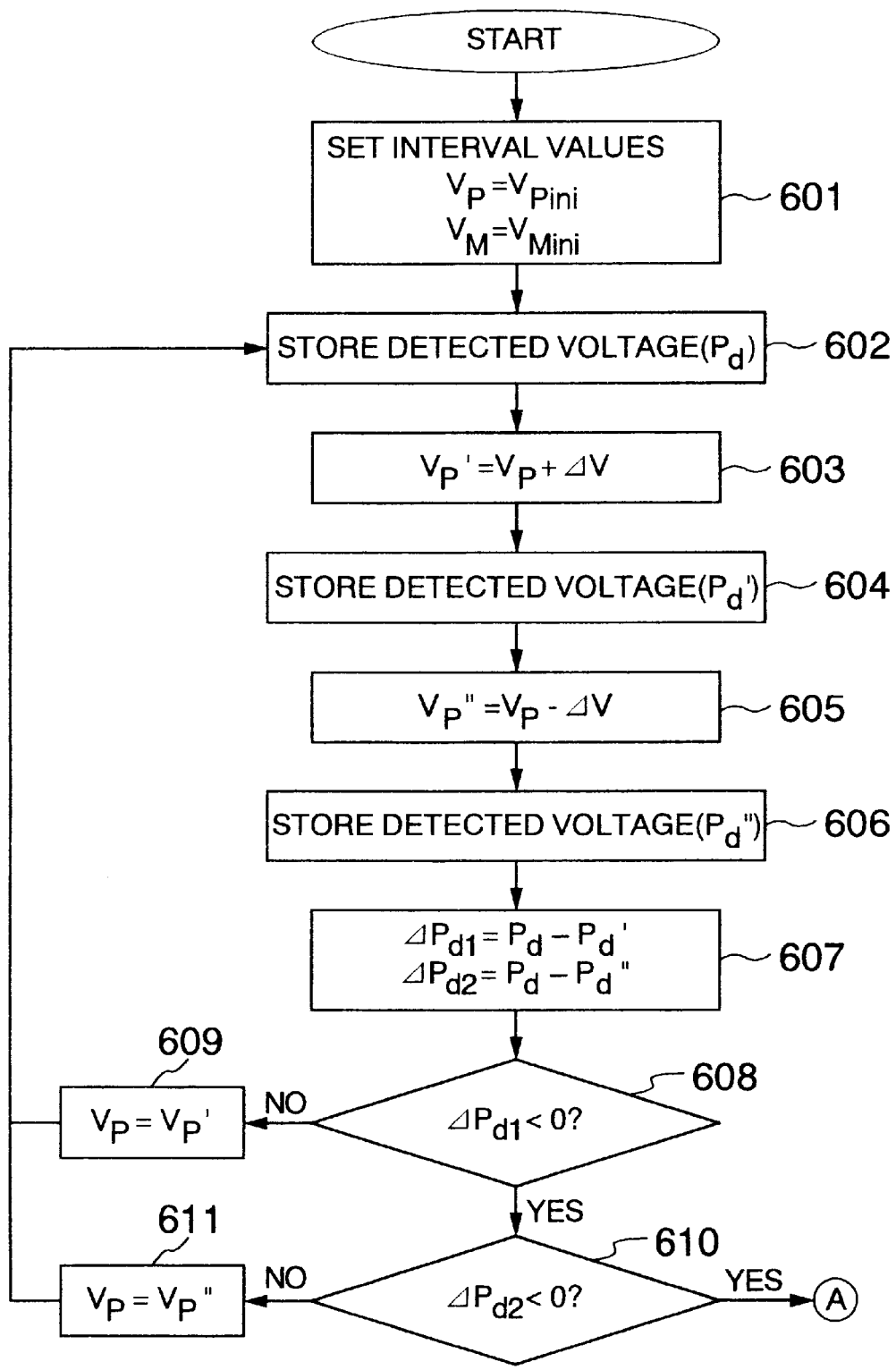
FIGS. 6A and 6B are flowcharts used to explain an example of an operation of the main signal control section shown in FIG. 5.

Initially, referring to FIG. 6A, in the activation such as when the power amplifier is energized, the phase-control voltage $V_P$ and the amplitude-control voltage $V_M$ are set to proper initial values $V_{pini}$, $V_{mini}$, respectively (step 601). Then, on the basis of the output from the A/D converter 133, an error signal electric power $P_d$ (electric power of the error signal branched from the directional coupler 27) obtained at that time is detected and stored in the internal memory (not shown) (step 602). Then, $V_P+\Delta V=V_P'$ is calculated by adding a very small voltage $\Delta V$ to the phase-control voltage value $V_P$ (initially, set to the initial value $V_{pini}$) (step 603). Further, an error signal electric power $P_d'$ obtained at that time is calculated and then stored in the internal memory (step 604). On the other hand, $V_P-\Delta V=V_P''$ is calculated by subtracting $\Delta V$ from the phase-control voltage $V_P$ (initially, set to the initial value $V_{pni}$). Further, an error signal electric power $P_d''$ presented at that time is calculated and then stored in the internal memory (step 606).

Then, from the electric power values $P_d$, $P_d'$, $P_d''$ stored at the steps 602, 604, 606, there are calculated $P_d-P_d'=\Delta P_{d1}$, $P_d-P_d''=\Delta P_{d2}$ (step 607). Then, it is determined whether or not $\Delta P_{d1}<0$, i.e. the error electric power is increased when $V_P$ is increased (step 608). If the error electric power is not increased, i.e. $\Delta P_{d1}\geq 0$, then $V_P'$ is regarded as new $V_P$ (step 609), and control goes back to the step 602. If on the other hand the error electric power is increased, then control goes to a decision step 610. In the decision step 610, it is determined whether or not $\Delta P_{d2}<0$ i.e. the error electric power is increased when $V_P$ is decreased. If the error electric power is not increased, i.e. $\Delta P_{d2}\geq 0$, then $V_P''$ is regarded as new $V_P$ (step 611), and control goes back to the step 602. If on the other hand the error electric power is increased, then control goes to a step 620. In this manner, the voltage $V_P$ obtained when a YES is outputted at the step 610, i.e. the voltage $V_P$ obtained if the error electric power is increased when the phase-control voltage $V_P$ is increased or decreased is calculated as the optimum value of the phase-control voltage $V_P$ which minimizes the detection electric power of the error signal branched from the directional coupler 27.

Figure 6B:
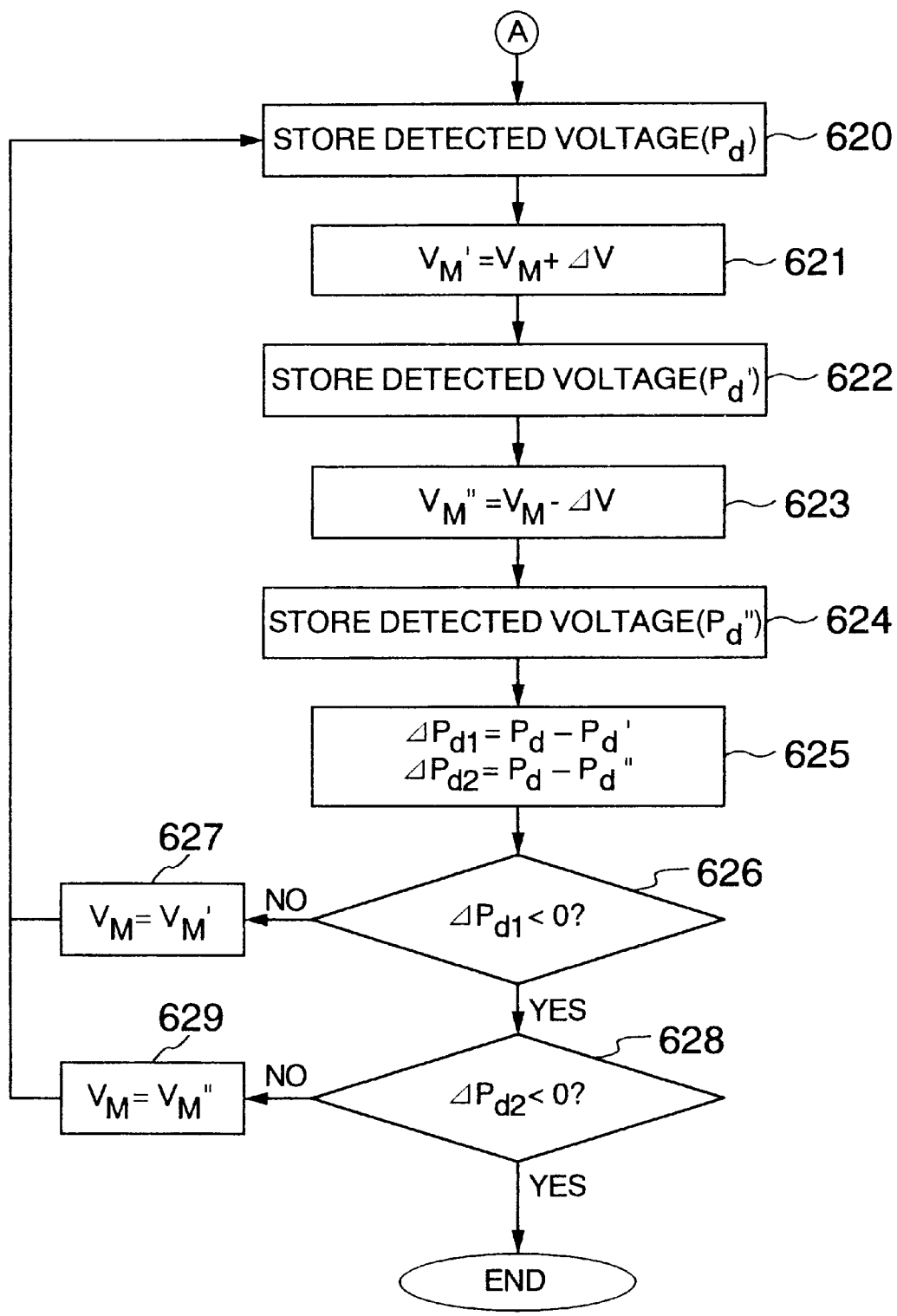

As shown in the flowchart of FIG. 6B, in the steps following the step 620, a similar processing is effected on the amplitude-control voltage $V_M$ (steps 620 to 629). Referring to FIG. 6B, initially, the error signal electric power $P_d$ (electric power of the error signal branched from the directional coupler 27) is detected and then stored in the internal memory (not shown) (step 620). Then, $V_M+\Delta V=V_M'$ is calculated by adding the very small voltage $\Delta V$ to the amplitude-control voltage $V_M$ (initially, the initial value $V_{mini}$) (step 621). Further, the error signal electric power $P_d'$ presented at that time is calculated and then stored in the internal memory (step 622). On the other hand, $V_M-\Delta V=V_M''$ is calculated by subtracting $\Delta V$ from the amplitude-control voltage $V_M$ (initially, set to the initial value $V_{mini}$) (step 623). Further, the error signal electric power $P_d''$ presented at that time is obtained and then stored in the internal memory (step 624).

Then, from the electric power values $P_d$, $P_d'$, $P_d''$ stored in the steps 620, 622, 624, there are calculated $P_d-P_d'=\Delta P_{d1}$, $P_d-P_d''=\Delta P_{d2}$ (step 625). In the next decision step 626, it is determined whether or not $\Delta P_{d1}<0$, i.e. the error electric power is increased when $V_M$ is increased. If the error electric power is not increased, i.e. $\Delta P_{d1}\geq 0$, then $V_M'$ is regarded as new $V_M$ (step 627) and then control goes back to the step 620. If on the other hand the error electric power is increased, then control goes to a decision step 628. In the decision step 628, it is determined whether or not $\Delta P_{d2}<0$, i.e. the error electric power is increased when $V_M$ is decreased. If the error electric power is increased, i.e. $\Delta P_{d2}\geq 0$, then $V_M''$ is regarded as $V_M''$. (step 629) and then control goes back the step 620. If on the other hand the error electric power is increased, then the processing is ended. In this manner, the voltage $V_M$ obtained when a YES is outputted at the step 628, i.e. the voltage $V_M$ presented if the error electric power is increased when the amplitude-control voltage $V_M$ is increased or decreased may be obtained as the optimum value of the amplitude-control voltage $V_M$ which minimizes the detection electric power of the error signal branched from the directional coupler 27.

The optimum value of the phase-control voltage $V_P$ and the optimum value of the amplitude-control voltage $V_M$ thus obtained by the above-mentioned processing are converted into analog values by the D/A converters 135-1, 135-2 and supplied to the vector adjustment section 3 to control the phase and the amplitude of the vector adjustment section 3. Accordingly, when the phase and the amplitude of the vector adjustment section 3 are controlled to be the optimum values as described above, in the output from the subtracter 10, the main signal component is suppressed sufficiently and only the distortion component exists so that the total electric power of the error signal branched from the directional coupler 27 is minimized.

Figure 7:
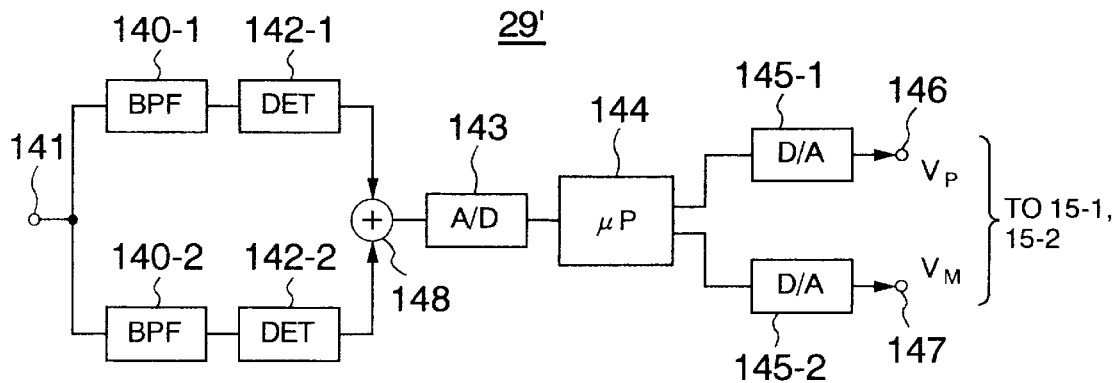
FIG. 7 is a block diagram showing an example of an error signal control section in the second embodiment shown in FIG. 4.

Then, the arrangement and operation of the error signal control section 29' (CONT2) will be described. FIG. 7 is a block diagram showing an example of the error signal control section 29' (CONT2). The error signal control section 29' shown in FIG. 7 is the example which controls the vector adjustment sections 15-1, 15-2 on the basis of the common phase-control voltage $V_P$ and the common amplitude-control voltage $V_M$ from the error signal control section 29'.

Referring to FIG. 7, the up-link signal (U.L.) and the down-link signal (D.L.) branched from the directional coupler 26 are inputted to a signal input terminal 141. The signal from the signal input terminal 141 is supplied to a bandpass filter (BPF) 140-1, in which there is extracted a signal component out of the band of the up-link signal of the signals branched from the directional coupler 26, i.e. signal component (distortion component) out of the band of the main signal component UL of the up-link signal. Also, the signal from the signal input terminal 141 is supplied to the bandpass filter (BPF) 140-2, in which there is extracted the signal component out of the band of the down-link signal of the signals branched from the directional coupler 26, i.e. the signal component (distortion component) out of the band of the main signal component UL of the down-link signal.

The signal component of the up-link signal extracted by the bandpass filter (BPF) 140-1 is detected by a detector 142-1, converted into a baseband signal and then inputted to an adder 148. Similarly, the signal component out of the band of the down-link signal extracted by the bandpass filter (BPF) 140-2 is detected by a detector 142-2, converted into a baseband signal and added to the adder 148. The output from the adder 148 is quantized by an A/D converter 143 and then supplied to a microprocessor 144. The microprocessor 144 sets, based on the quantized signal, proper values of the phase-control voltage $V_P$ and the amplitude-control voltage $V_M$ for the vector adjustment sections 15-1, 15-2 in such a manner that the outputs of the vector adjustment sections 15-1, 15-2 become optimum phases and optimum levels. Then, the microprocessor 144 supplies the proper value of the phase-control voltage $V_P$ from a D/A converter 145-1 through an output terminal 146 to the respective vector adjustment sections 15-1, 15-2, and also supplies the proper value of the amplitude-control voltage $V_M$ through a D/A converter 145-2 through an output terminal 147 to the respective vector adjustment sections 15-1, 15-2. That is, if the main signal having the distortion and the extracted distortion component are not synthesized with proper phase and amplitude by the directional coupler 7, then the distortion compensation operation becomes incomplete so that the signal in which the distortion component is not suppressed sufficiently is outputted in the output from the directional coupler 7. Accordingly, the vector adjustment sections 15-1, 15-2 are controlled in such a manner that the respective outputs from the vector adjustment sections 15-1, 15-2 become the optimum phases and optimum levels, whereby the signal in which the distortion component is suppressed sufficiently is outputted in the output from the directional coupler 7. Thus, the distortion compensation operation may be made complete.

Figure 8:
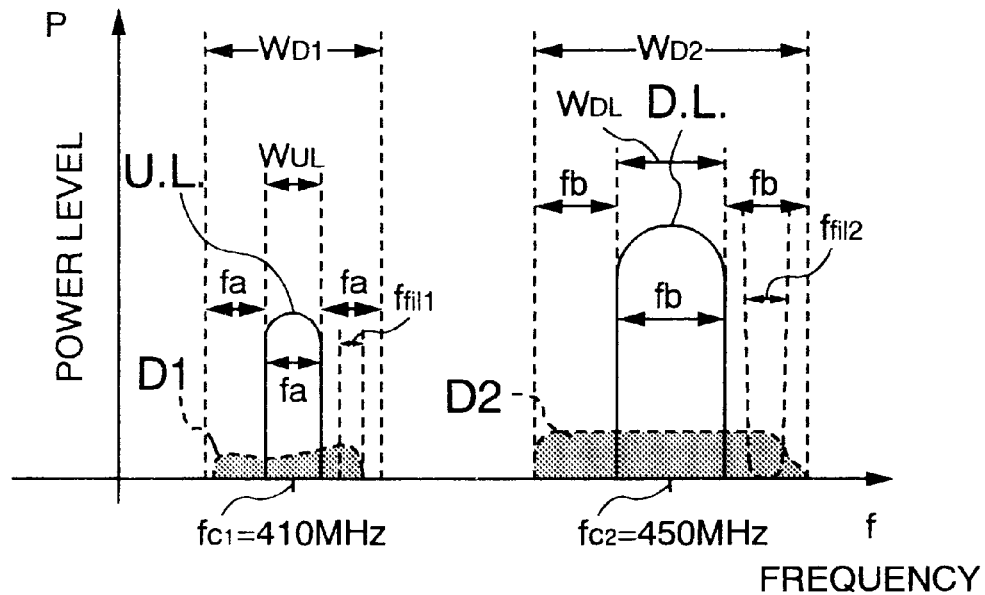
FIG. 8 is a diagram showing a relationship of respective frequencies of a transmission signal, a distortion component and a signal extracted by the bandpass filter in the second embodiment shown in FIG. 4.

Here, the characteristics of the bandpass filters (BPF) 140-1, 140-2 will be described. FIG. 8 is a diagram showing a relationship of respective frequencies of the transmission signal, the distortion component and the signals extracted by the bandpass filters in the embodiment of the present invention.

The characteristics of the bandpass filters 140-1, 140-2 fall within the bands which can extract the distortion components generated out of the transmission bands of the transmission signals U.L., D.L. in actual practice. Here, assuming the fc1 is the center frequency of the up-link transmission signal U.L., fa is the band width of the up-link transmission signal and $f_{fil1}$ is the band of the bandpass filter 140-1, the relationship of the respective frequencies is presented as:

$$\left[ fc1 + \frac{fa}{2} \right] < f_{fil1} < \left[ fc1 + \frac{3fa}{2} \right]$$

or $$\left[ fc1 - \frac{3fa}{2} \right] < f_{fil1} < \left[ fc1 - \frac{fa}{2} \right]$$

Similarly, assuming that fc2 is the center frequency of the down-link transmission signal D.L., fb is the band width of the down-link transmission signal and $f_{fil2}$ is the band of the bandpass filter 140-2, then the relationship of the respective frequencies is presented as:

$$\left[ fc2 + \frac{fb}{2} \right] < f_{fil2} < \left[ fc2 + \frac{3fb}{2} \right]$$

or $$\left[ fc2 - \frac{3fb}{2} \right] < f_{fil2} < \left[ fc2 - \frac{fb}{2} \right]$$

The distortion signals extracted by the bandpass filters 140-1, 140-2 are detected and the electric powers thereof are calculated. Then, the vector adjustment sections 15-1, 15-2 are adjusted based on the calculated values. If the vector adjustment sections 15-1, 15-2 are set to the optimum points, then the suppressed amounts of the electric powers are maximized so that the distortion electric powers extracted by the directional coupler 26 and the bandpass filters 140-1, 140-2 can be minimized. The band widths of the bandpass filters need not always pass the whole of the bands expressed in the above-mentioned equations and may extract a part of the bands expressed in the above-mentioned equations, if necessary.

According to the above-mentioned arrangement, when the feedforward control is effected properly, the levels of the signals extracted by the bandpass filters 140-1, 140-2 are lowered so that the computation algorithm in the microprocessor 144 can use the same algorithm as that of the flowchart shown in FIGS. 6A, 6B.

The vector adjustment sections 15-1, 15-2 may be controlled based on the signal extracted from one of the up-link and down-link transmission signals from the directional coupler 6. In that case, it is possible to delete one of a combination of the bandpass filter 140-1 and the detector 142-1 for the up-link transmission signal or a combination of the bandpass filter 140-2 and the detector 142-2 for the down-link transmission signal.

Figure 9:
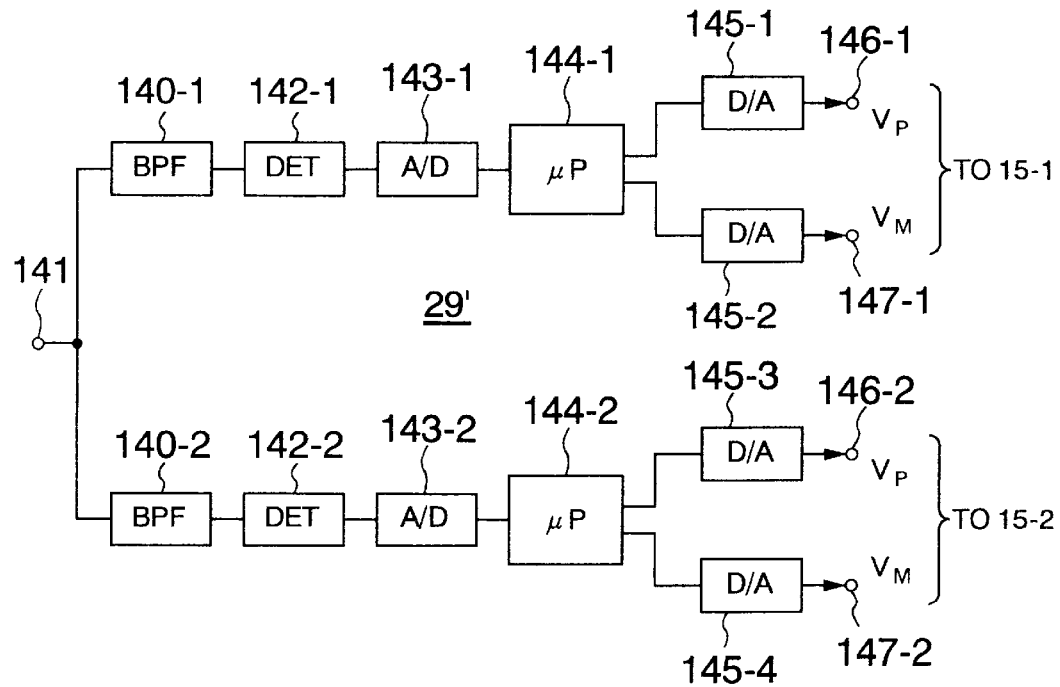
FIG. 9 is a block diagram showing another example of the error signal control unit in the second embodiment shown in FIG. 4.

Next, another example of the arrangement of the error signal control section 29' (CONT2) and its operation will be described. FIG. 9 is a block diagram showing another example of the error signal control unit 29' (CONT2). The error signal control section 29' is adapted to control the vector adjustment sections 15-1, 15-2 by respective phase-control voltages $V_P$ and respective amplitude-control voltages $V_M$ from the error signal control section 29', by way of example. In this case, the adder 148 is deleted, and the A/D converter 143, the microprocessor 144 and the D/A converters 145-1, 145-2 are respectively provided for every up-link and down-link transmission signals. Specifically, an A/D converter 143-1, a microprocessor 144-1 and D/A converters 145-1, 145-2 are provided for the up-link transmission signal. Also, an A/D converter 143-2, a microprocessor 144-2 and D/A converters 145-3, 145-4 are provided for the down-link transmission signal. The phase-control voltage $V_P$ and the amplitude-control voltage $V_M$ from the D/A converters 145-1, 145-2 are supplied through output terminals 146-1, 147-1 to the vector adjustment section 15-1. Also, the phase-control voltage $V_P$ and the amplitude-control voltage $V_M$ from the D/A converters 145-3, 145-4 are supplied through terminals 146-2, 147-2 to the vector adjustment section 15-2.

As the computation algorithms in the respective microprocessors 144-1, 144-2, there can be used the same algorithm as that of the flowchart of FIGS. 6A, 6B. Alternatively, it is possible that the microprocessors 144-1, 144-2 is comprised of one microprocessor which can be operated in a time-sharing fashion.

Further, as the method of controlling the first and second vector adjustment sections 3, 15-1 and 15-2 in the embodiment shown in FIG. 4, it is possible to use the pilot signal that has been described in the example of the conventional power amplifier. A third embodiment in which the control is effected by using the pilot signal will be described with reference to FIGS. 10 and 11.

Similarly to the above-mentioned embodiments, in order to enable the power amplifier to operate stably relative to the change of the surrounding circumstances and the aging change, an example of the manner in which the first vector adjustment section 3 comprising the main signal-system line and the second vector adjustment sections 15-1, 15-2 of the distortion compensation-system line are controlled during communication will be described.

Figure 10:
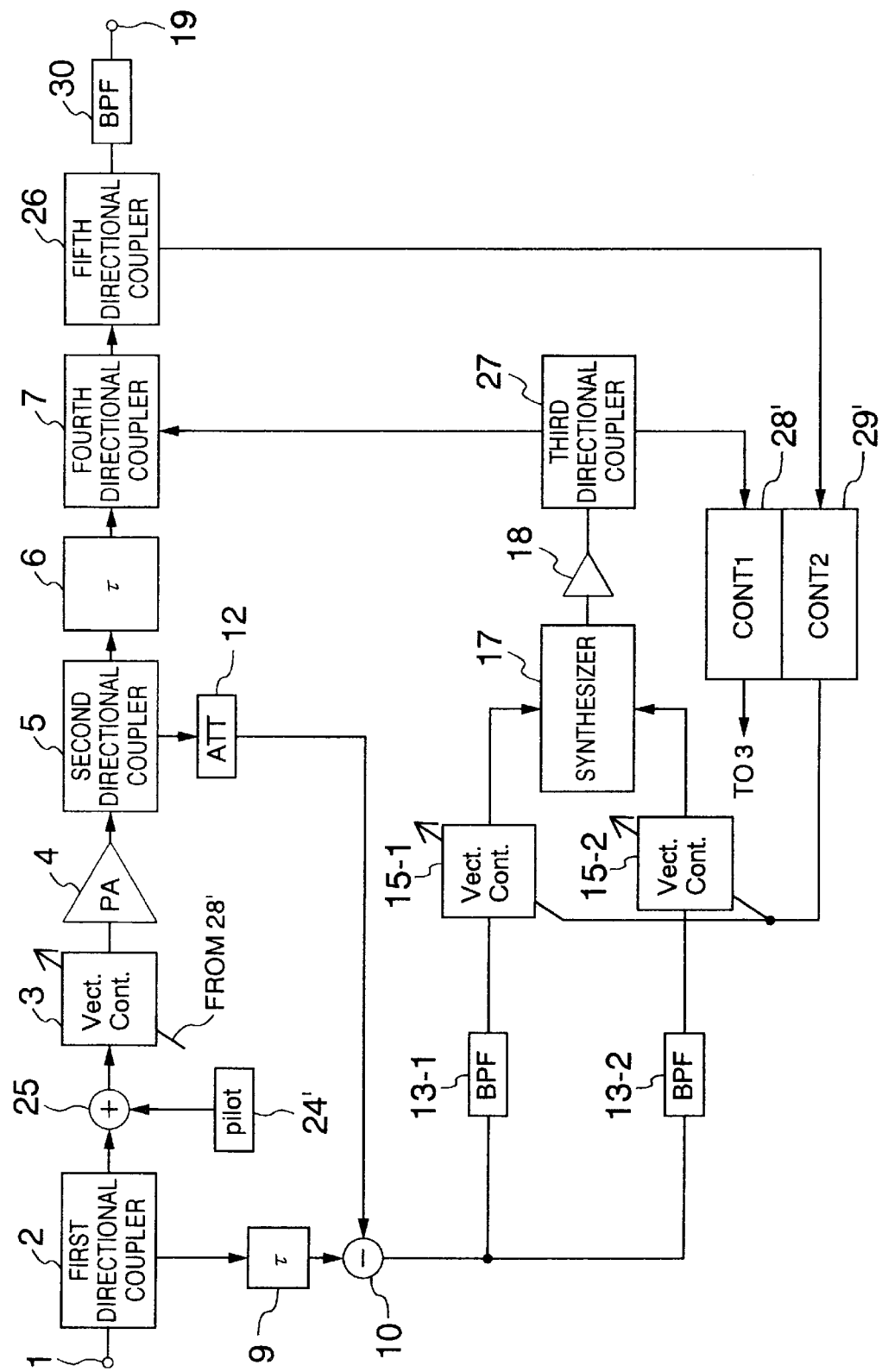
FIG. 10 is a block diagram showing a power amplifier according to a third embodiment of the present invention.

FIG. 19 is a block diagram showing an example in which a function for adding a pilot signal is added to the embodiment shown in FIG. 4. In FIG. 10, elements and parts having similar functions are marked with the same reference numerals. The circuit arrangement of FIG. 10 is almost the same as that of FIG. 4 and includes the following elements and parts added thereto. Specifically, as shown in FIG. 10, there is provided an adder 25 in a signal line between the first directional coupler 2 and the first vector adjustment section 3. As shown in FIG. 10, a signal inputted to the input terminal 1 is supplied through the first directional coupler 2 and the adder 25 to the first vector adjustment section 3. Also, there is provided a pilot signal generating section 24' which is connected to the above-mentioned adder 25.

Figure 11:
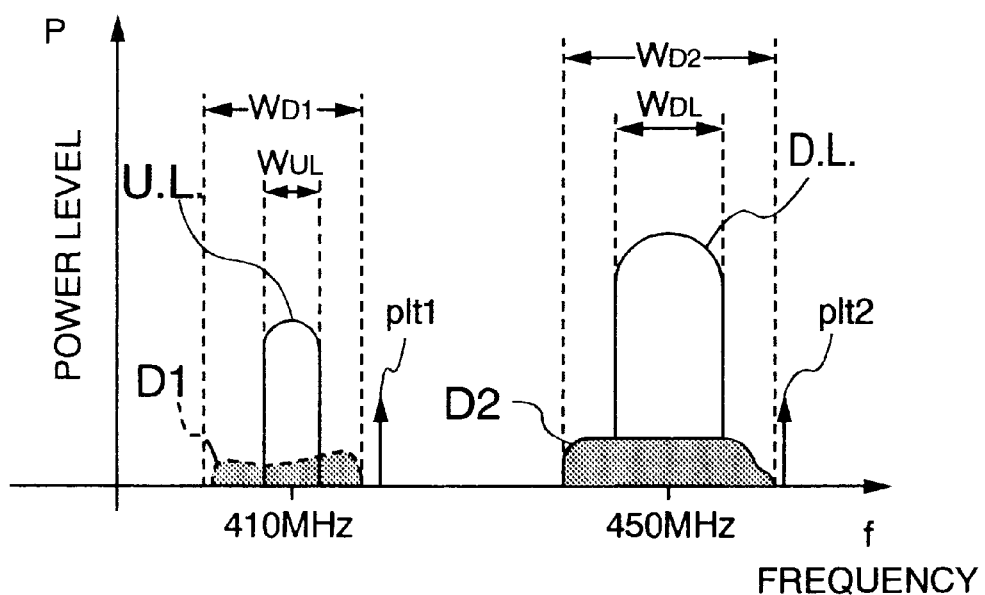
FIG. 11 is a diagram showing a relationship of respective frequencies of a transmission signal, a distortion component and a pilot signal in the third embodiment shown in FIG. 10.

An operation of the power amplifier shown in FIG. 10 is substantially the same as that of the power amplifier shown in FIG. 4, and therefore the main signal transmission section and the distortion compensation section need not be described in detail. FIG. 11 is a diagram showing an example of a signal spectrum obtained after the pilot signal was inserted with respect to the main signal and the distortion component according to the present invention. In FIG. 11, a horizontal axis f represents a frequency, a vertical axis represents a power level, U.L. represents an output level of an up-link signal, D.L. represents an output level of a down-link signal, plt1 represents a pilot signal obtained near the up-link signal, plt2 represents a pilot signal obtained near the down-link signal, D1 represents a distortion component of the up-link signal and D2 represents a distortion component of the down-link signal.

Referring to FIG. 10, the pilot signal generating section 24' generates a pilot signal plt1 having a single frequency near the frequency of the up-link signal (U.L.), and also generates a pilot signal plt2 having a single frequency near the frequency of the down-link signal (D.L.). These two pilot signals plt1, plt2 are inputted to the adder 25. The adder 25 adds these pilot signals plt1, plt2 to a signal inputted to the vector adjustment section 3. FIG. 11 shows the state of the frequency spectrum obtained at that time. Since the pilot signals plt1, plt2 are inserted into the preceding stage of the power amplifying section 4, they appear as a part of the distortion signal in the signal system shown in FIG. 10. Accordingly, having paid attention to the pilot signals plt1, plt2, the main signal control section 28' controls the first vector adjustment section 3 in such a manner that its signal level may be minimized. Also, with respect to the second vector adjustment sections 15-1, 15-2, the error signal control section 29' detects the signal branched from the fifth directional coupler 26 and the main signal control section 28' controls the second vector adjustment sections 15-1, 15-2 in such a manner that the levels of the pilot signals plt1, plt2 contained in the detected signal may be minimized.

In this embodiment, the arrangement and the operation of the main signal control section 28' (CONT1) may be the same as those of FIG. 5. Also, the arrangement and the operation of the error signal control unit 29' (CONT2) may be the same as those of FIG. 7 or FIG. 9. In this case, the bandpass filters 140-1, 140-2 are arranged so as to extract the pilot signals plt1, plt2, respectively.

As a consequence, since the signal transmitted from the output terminal 19 in actual practice does not require the pilot signal, a bandpass filter 30 is interposed between the directional coupler 26 and the output terminal 19 so that the pilot signals plt1, plt2 are canceled from the transmission signal and then the transmission signal is outputted from the output terminal 19.

Figure 12:
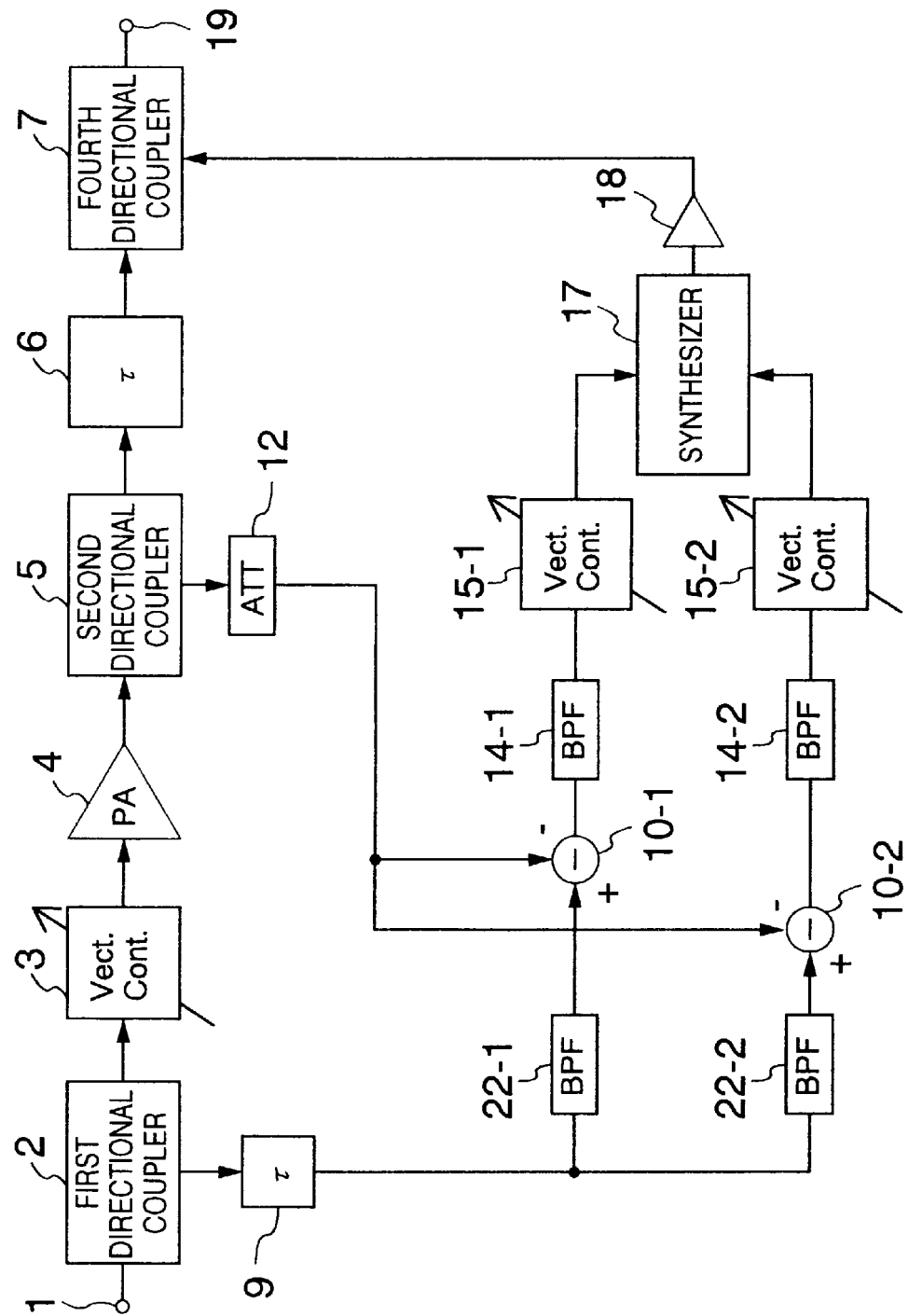
FIG. 12 is a block diagram showing a power amplifier according to a fourth embodiment of the present invention.

A fourth embodiment according to the present invention will be described next with reference to FIG. 12. In FIG. 12, elements and parts having equivalent functions to those of the first embodiment shown in FIG. 3 are marked with the same references. In FIG. 12, reference numerals 22-1, 22-2, 14-1 and 14-2 depict bandpass filters, and reference numerals 10-1, 10-2 depict subtracters. The circuit arrangement of FIG. 12 is substantially the same as that shown in FIG. 3. As shown in FIG. 12, the output from the first delay element 9 is inputted to the two bandpass filters 22-1 and 22-2. The bandpass filter 22-1 is connected through the bandpass filter 14-1 to the second vector controller 15-1. In a like manner, the bandpass filter 22-2 is connected through the subtracter 10-2 and the bandpass filter 14-2 to the second vector controller 15-2. Also, the output from the attenuator 12 is inputted to the two subtracters 10-1 and 10-2. A rest of the connections is exactly the same as that of FIG. 3.

An operation of this embodiment will be described hereinafter.

Signals of the two carrier-frequency bands of the up-link signal and the down-link signal are inputted to the input terminal 1. These signals inputted to the input terminal 1 are outputted from the input terminal 1 as one signal and then supplied to the first directional coupler 2. The first directional coupler 2 branches and outputs the inputted signal. One of the branched output signals is of the main signal transmission section, and supplied through the first vector adjustment section 3 to the power amplifying section 4. The signal operation of the main signal transmission section is the same as that of the first embodiment shown in FIG. 3, and therefore will not be described hereinafter.

The other of the branched output signals is supplied to the distortion compensation section. The first delay element 9 delays the inputted signal by the same delay amount as that produced in the elements 3 to 5 and 12 of the main signal transmission section line, and supplies the signal thus delayed to both of the bandpass filters 22-1 and 22-2. The bandpass filter 22-1 has the passband WUL shown in FIG. 8 to extract the up-link signal U.L. and supplies the extracted signal to the subtracted input terminal of the subtracter 10. Similarly, the bandpass filter 22-2 has the passband WDL shown in FIG. 8 to extract the down-link signal D.L. and supplies the extracted signal to the subtracted input terminal of the subtracter 10-2.

Then, the output signal from the attenuator 12 is supplied to both subtracted input terminals of the subtracters 10-1, 10-2, and the subtracters 10-1, 10-2 execute the calculations by the inputted subtracting values and the inputted subtracted values. The output signal from the subtracter 10-1 is supplied through the bandpass filter 14-1 having the passband WD1 shown in FIG. 8 to the second vector controller 15-1. Also, the output signal from the subtracter 10-2 is supplied through the bandpass filter 14-2 having the passband WD2 shown in FIG. 8 to the second vector controller 15-2.

The states of the signals obtained at that time will be described with reference to FIG. 8 which shows an example of the signal spectrum. The signals inputted to the two subtracters 10-1, 10-2 from the attenuator 12 are the up-link signal U.L. and the down-link signal D.L. and the distortion components D1, D2 of the up-link signal U.L. and the down-link signal D.L. On the other hand, since the output from the bandpass filter 22-1 is only the up-link signal U.L., as the subtracted output of the subtracter 10-1, there are outputted the down-link signal D.L. and the distortion components D2, D1 of both of the down-link signal D.L. and the up-link signal U.L. Similarly, the subtracter 10-2 outputs the up-link signal U.L. and the distortion components D1, D2 of both the up-link signal U.L. and the down-link signal D.L. The bandpass filter 14-1 extracts only the distortion component D1 of the down-link signal D.L. from these signals, and the bandpass filter 14-2 extracts only the distortion component D2 of the up-link signal U.L. from these signals. At that time, as the characteristics of the bandpass filters 14-1, 14-2, the main signal components in the respective attenuation regions, i.e. the down-link signal D.L. in the bandpass filter 14-1 and the up-link signal U.L. in the bandpass filter 14-2 should be attenuated to the sufficiently low level relative to the distortion component D2 or D1 that was passed through the passband. For example, let it be assumed that a level difference between the up-link signal U.L. and the down-link signal D.L. is 10 dB (U.L.<D.L.) and that the levels f the distortion components generated in the respective bands are respectively 30 dB. At that time, in order to suppress the level of the down-link signal D.L. by 10 dB relative to the distortion component D1 passed through the bandpass filter 14-1, it is sufficient that the attenuation amount in the down-link signal band may be greater than 50 dB. With respect to the bandpass filter 14-2, from a similar standpoint, it is sufficient that the attenuation amount in the up-link signal band may be greater than 30 dB.

The second vector adjustment sections 15-1, 15-2 are adjusted in such a manner that the outputs of the bandpass filter 14-1, 14-2 may have the opposite phases and the same levels relative to the up-link/down-link bands contained in the signal inputted from the second delay element 7 by the fourth directional coupler 7. After the adjusted distortion components are synthesized by the synthesizer 17 and amplified by the error amplifier 18, they are synthesized and their error components are canceled each other out by the fourth directional coupler 7 and then outputted from the output terminal 19. Here, the second delay element 6 is adapted to absorb the delay produced in the error amplifier 18.

Figure 13:
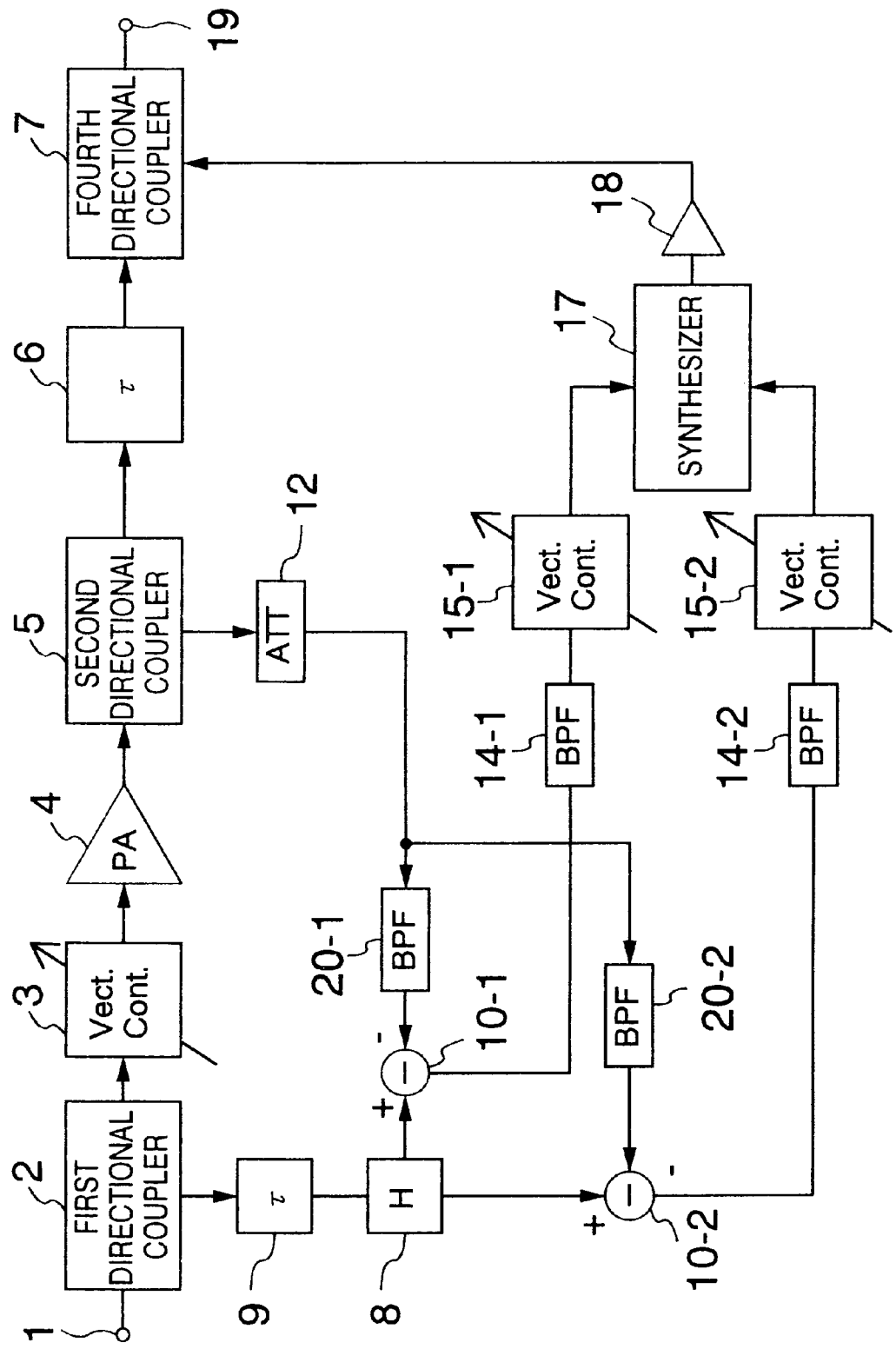
FIG. 13 is a block diagram showing a power amplifier according to a fifth embodiment of the present invention.

A fifth embodiment shown in FIG. 13 will be described next. In FIG. 13, elements and part having functions equivalent to those of FIG. 12 are marked with the same reference numerals. In FIG. 13, reference numerals 20-1 and 20-2 depict bandpass filters, respectively. The circuit arrangement of FIG. 13 is substantially the same as that of FIG. 12. As shown in FIG. 13, the output from the first delay element 9 is inputted through the branching filter (H) 8 to the subtracters 10-1 and 10-2. Also, the output from the subtracter 12 is inputted to the two bandpass filters 20-1 and 20-2. The bandpass filter 20-1 is connected through the subtracter 10-1 and the bandpass filter 14-1 to the second vector controller 15-1. Similarly, the bandpass filter 20-2 is connected through the subtracter 10-2 and the bandpass filter 14-2 to the second vector controller 15-2. A rest of connections is exactly the same as that of the embodiment shown in FIG. 12.

An operation of the embodiment shown in FIG. 13 will be described hereinafter.

Similarly to the aforementioned fourth embodiment, signals of the two carrier-frequency bands of the up-link signal and the down-link signal are inputted to the input terminal 1. These signals inputted to the input terminal 1 are outputted from the input terminal 1 as one signal and then supplied to the first directional coupler 2. The first directional coupler 2 branches and outputs the inputted signal. One of the branched output signals is supplied through the main signal transmission section, i.e. the first vector adjustment section 3 to the power amplifying section 4. The signal operation of the main signal transmission section is the same as that of the first embodiment shown in FIG. 3, and therefore will not be described hereinafter.

The other of the branched output signals is supplied to the distortion compensation section. That is, the first delay element 9 delays the inputted signal so as to absorb the delay amount produced in the vector adjustment section 3 and the power amplifying section 4 of the main signal transmission section line. The output from the delay element 9 is branched by the branching filter 8 into two signals of the same level. The two signals are supplied to the subtracted input terminals of the subtracters 10-1 and 10-2.

On the other hand, the signal inputted to the power amplifying section 4 is given a distortion due to the characteristics of the power amplifying section 4. A part of the output electric power of the power amplifying section 4 is extracted by the directional coupler 5, and supplied through the attenuator 12 to both of the bandpass filters 20-1 and 20-2. The signal inputted to the attenuator 12 is level-adjusted by the attenuator 12 and supplied to the bandpass filters 20-1, 20-2 so that it is separated into the band of the up-link signal and the band of the down-link signal and then inputted to the subtracters 10-1, 10-2. The bandpass filter 20-1 has the passband WD1 to extract the up-link signals (U.L., D1) and supplies the extracted signal to the subtracted input terminal of the subtracter 10-1. Similarly, the bandpass filter 20-2 has the passband WD2 to extract the down-link signals (D.L., D2) and supplies the extracted signal to the subtracted input terminal of the subtracter 10-2. The subtracters 10-1 and 10-2 execute the calculations by the inputted subtracting values and the subtracted values. The output signal from the subtracter 10-1 is supplied through the bandpass filter 14-1 to the second vector controller 15-1. Also, the output signal from the subtracter 10-2 is supplied through the bandpass filter 14-2 to the second vector controller 15-2. An operation that follows is similar to that of FIG. 12, and therefore need not be described.

Here, the manner in which the signals are processed by the subtracters 10-1, 10-2 will be described with reference to FIG. 8 similarly to the aforementioned embodiment. The output of the branching filter 8 comprises the input signals without distortion, i.e. the up-link signal U.L. and the down-link signal D.L. The output of the bandpass filter 20-1 comprises the up-link signal with the distortion, i.e. U.L. and D1. The output of the bandpass filter 20-2 comprises the down-link signal with the distortion, i.e. D.L. and D2. In the subtracter 10-1, since (U.L.+D1)−(U.L.+D.L.), its output contains both the distortion component D1 of the up-link signal band and the down-link signal (opposite phase). Similarly, in the output of the subtracter 10-2, there appear the distortion component D2 of the down-link signal band and the up-link signal (opposite phase). The subtracters 10-1, 10-2 supplies these signals to the bandpass filter 14-1 having the passband WD1 and the bandpass filter 14-2 having the passband WD2 to thereby extract the distortion components D1, D2 of the respective bands.

The distortion components of the up-link/down-link bands, separated by the bandpass filters 14-1, 14-2 are supplied to and adjusted by the vector adjustment sections 15-1, 15-2 in such a manner that the distortion components contained in the output from the error amplifier 18 and the output of the delay element 6 are synthesized with opposite phases and the same level by the directional coupler 7. The distortion components from the vector adjustment sections 15-1, 15-2 are synthesized by the synthesizer 17, amplified by the error amplifier 18 and synthesized with the output from the delay element 6 by the directional coupler 7, thereby resulting in the distortion components being canceled each other out. Accordingly, only the signal components U.L. and D.L. are outputted from the output terminal 19.

Also, with respect to the respective embodiments shown in FIGS. 12, 13, similarly to the embodiment shown in FIG.

10, by controlling the respective vector adjustment sections 3, 15-1, 15-2 adaptively with the main signal and error signal control sections 28', 29' or the like, it becomes possible to follow the change of the surrounding circumstances such as a temperature and the aging change.

Figure 14:
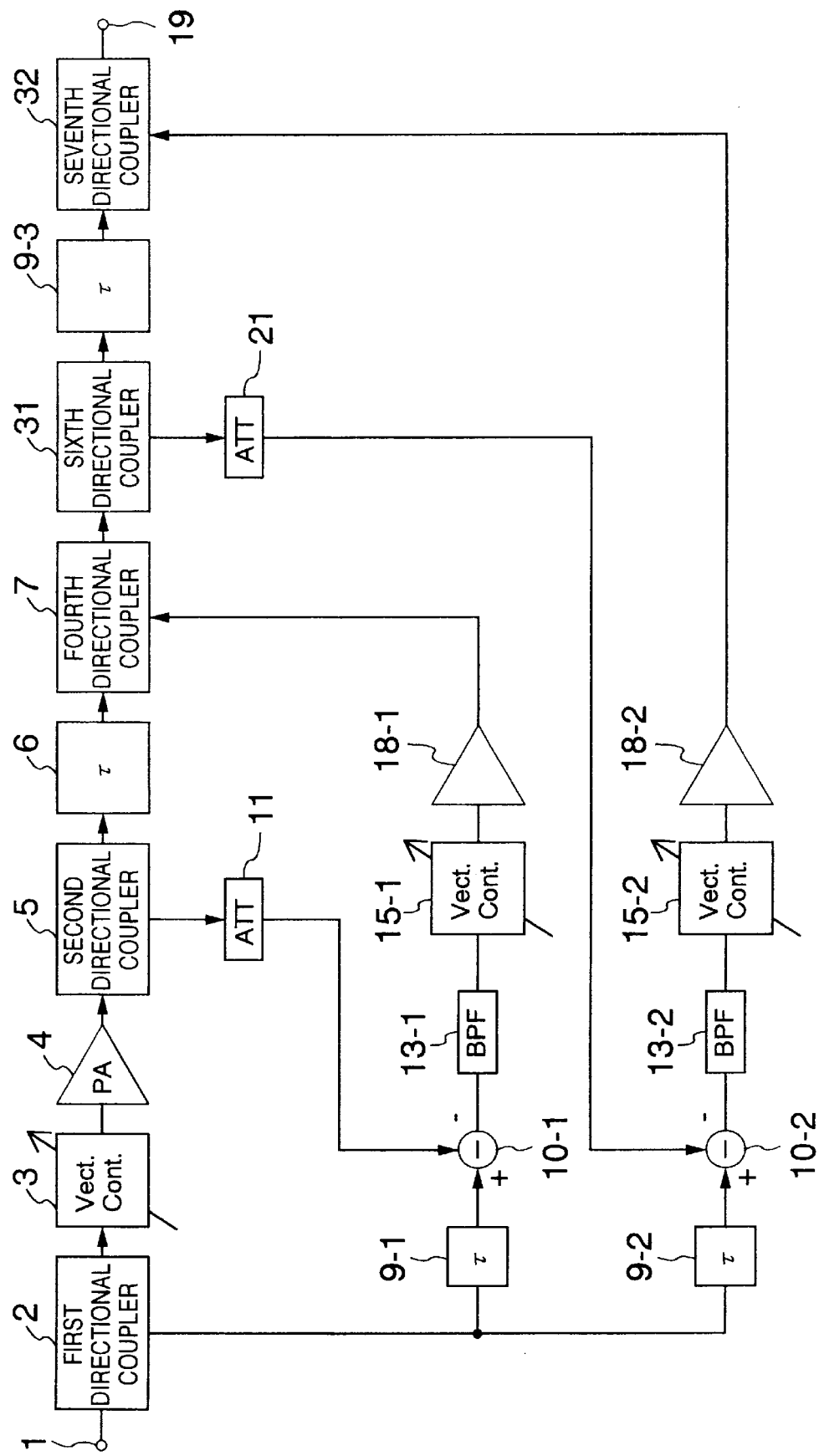
FIG. 14 is a block diagram showing a power amplifier according to a sixth embodiment of the present invention.

FIG. 14 is a block diagram showing a sixth embodiment according to the present invention. In FIG. 14, elements and parts having functions equivalent to those of the above-mentioned respective embodiments are marked with the same reference numerals. In FIG. 14, reference numerals 9-1, 9-2 depict first and second delay elements, 9-3 a third delay element, 11 a first attenuator (ATT), 18-1, 18-2 error amplifiers, 21 a second attenuator (ATT), 32 a sixth directional coupler (branching filter) and 7 a seventh directional coupler (synthesizer).

The input terminal 1 is connected through the first directional coupler 2 to the first vector adjustment section 3 and the first and second delay elements 9-1, 9-2. The first vector adjustment section 3 is connected through the power amplifying section 4, the second directional coupler 5, the second delay element 6 and the fourth directional coupler 7 to the sixth directional coupler 31. The sixth directional coupler 31 is connected through the third delay element 9-3 and the seventh directional coupler 32 to the output terminal 19. The first delay element 9-1 is connected to the subtracted input terminal of the subtracter 10-1. The subtracter 10-1 is connected through the bandpass filter 13-1, the second vector adjustment section 15-1 and the error amplifier 18-1 to the fourth directional coupler 7. Similarly, the first delay element 9-2 is connected to the subtracted input terminal of the subtracter 10-2, and the subtracter 10-2 is connected through the bandpass filter 13-2, the second vector adjustment section 15-2 and the error amplifier 18-2 to the seventh directional coupler 32. Also, the second directional coupler 5 is connected through the first attenuator 11 to the subtracting input terminal of the subtracter 10-1. The sixth directional coupler 31 is connected through the second attenuator 21 to the subtracting input terminal of the subtracter 10-2.

An operation of this embodiment will be described hereinafter. Referring to FIG. 14, the first directional coupler 2 branches and outputs the inputted signal. One of the branched output signals is supplied through the first vector adjustment section 3 to the power amplifying section 4 (main signal transmission section). The signal outputted from the power amplifying section 4 is supplied to the second directional coupler 5 and the signal is branched into two lines by the directional coupler 5. One of the branched signals is supplied through the second delay element 6 to the fourth directional coupler 7. Also, the other ones (U.L., D.L., D1, D2) of the signals branched by the second directional coupler 5 are inputted through the first attenuator 11 to the subtracting input terminal of the subtracter 10-1.

Next, the other of the branched output signals of the first directional coupler 2 is supplied to the subtracted input terminals of the first and second delay elements 9-1, 9-2 as the distortion compensation side signal. The first delay element 9-1 delays the phase of the inputted signal component, and delays the inputted signal by the same delay amount as those of the signal components (U.L., D.L.) of the main signal transmission section inputted to the subtracting input terminal of the subtracter 10-1.

The first attenuator 11 attenuates the level of the inputted signal level and matches the level of this signal with the signal level of the other signal inputted through the first delay element 9-1.

Although the power amplifying section 4 amplifies the inputted signal to a predetermined output signal level necessary for transmission, the output signal contains undesired distortion components D1, D2 generated due to the non-linearity of the power amplifying section 4 except the necessary main signals U.L., D.L. The subtracter 10-1 extracts the distortion components D1, D2 by calculating a difference between the two inputted signal. At that time, the first vector adjustment section 3 adjusts the amplitude and the phase of the inputted signal such that the output level and the phase of the first delay element 9-1 are made coincident with the level and the phase of the main signal inputted to the subtracting input terminal of the subtracter 10-1.

The distortion components D1, D2 outputted from the subtracter 10-1 are inputted through the bandpass filter 13-1 having the passband to separate/extract the up-link signal component, the second vector adjustment section 15-1 and the error amplifier 18 to the fourth directional coupler 7. The signal inputted to the fourth directional coupler 7 is converted into the distortion component D1 of only the up-link signal by the bandpass filter 13-1. The up-link signal distortion component thus extracted is supplied to and converted into the distortion component of the signal inputted to the fourth directional coupler 7 and the signal having the opposite phase. The two inputted signals are synthesized by the fourth directional coupler 7 and the up-link signal distortion components are canceled each other out, thereby making it possible to linearize the up-link signal.

In the output of the attenuator 11, there are contained, in addition to the up-link signal (U.L.) and the down-link signal (D.L.), the up-link signal distortion component (D1) and the down-link signal component distortion component (D2) generated in the power amplifier 4. On the other hand, signals that are inputted to the first delay element 9-1 are the up-link signal and the down-link signal. Since the adjustment is effected by the first vector adjustment section 3 in order that the phases and the level of the two input signals agree with each other, the subtracter 10-1 outputs only the distortion component D1 of the up-link signal band and the distortion component D2 of the down-link signal band. The two distortion components extracted by the subtracter 10-1 are supplied to the bandpass filter 13-1, and only the up-link signal distortion component D1 is separated/extracted by the bandpass filter 13-1 and supplied through the second vector adjustment section 15-1 to the error amplifier 18-1. The up-link signal distortion component thus separated/extracted is amplified by the error amplifier 18-1 and then supplied to the fourth directional coupler 7. The fourth directional coupler 7 cancels the up-link signal distortion components by synthesizing the signal (U.L.+D.L.+D1+D2) of the main signal transmission section inputted and the up-link signal distortion component, and supplies a resultant signal (U.L.+D.L.+D2) to the sixth directional coupler 31. Here, the second adjustment section 15-1 adjusts the phase and the level of the output from the adjustment section 15-1 in such a manner that, when the signals are synthesized by the fourth directional coupler 7, the distortion component of the error amplifier 18-1 becomes the opposite phase and the same level relative to the distortion component of the main signal transmission section. The second delay element 6 is inserted in order to absorb the delay generated from the signal line from the bandpass filter 13-1 to the error amplifier 18-1. The bandpass filter 13-1 may be comprised of the low-pass filter or a notch filter for canceling the component of the down-link. According to the above-mentioned operation, in the output of the fourth directional coupler 7, there are left the up-link signal, the down-link signal and the distortion component of the down-link signal. The output signal from the fourth directional coupler 7 is supplied to and branched into two signals by the sixth directional coupler 31. One of the branched signals is supplied through the third delay element 9-2 and the fourth directional coupler 32 to the output terminal 19, from which it is outputted. Also, the other of the signals branched by the sixth directional coupler 31 is supplied through the second attenuator 21 to the subtracting input terminal of the subtracter 10-2.

On the other hand, the signal without the distortion branched by the first directional coupler 2 and which is inputted to the second delay element 9-2 is delayed by the second delay element 9-2 by the same delay amount as the delay amount generated in the signal line from the first vector adjustment section 3 of the main signal transmission section to the fourth directional coupler 7, and then inputted to the subtracted input terminal of the subtracter 10-2. The subtracter 10-2 calculates a difference between the signals (U.L., D.L.) applied to the subtracted input terminal and the signals (U.L., D.L., D2) from the second subtracter 21. The output from the subtracter 10-2 is supplied to the bandpass filter 13-2 having the passband WD2, and the bandpass filter 13-1 separates/extracts only the down-link signal distortion component D2 from the supplied signal. However, if the up-link signal distortion component is sufficiently suppressed in the processing of the preceding stage, then the bandpass filter 13-1 may be omitted. Also, the band-pass filter 13-2 may be comprised of a high-pass filter or a notch filter for canceling the up-link signal component.

The down-link signal distortion component thus extracted is supplied to the error amplifier 18-2, amplified by the error amplifier 18-2 and then supplied to the seventh directional coupler 32. Here, the second vector adjustment section 15-2 adjusts the phase and the level of the output of the vector adjustment section 15-2 in such a manner that the distortion component from the error amplifier 18 becomes the opposite phase and the same level relative to the distortion component of the main signal transmission section inputted from the delay element 9-3 in the seventh directional coupler 32. The seventh directional coupler 32 synthesizes the signal D2 supplied from the error amplifier 18-2 and the signals (U.L., D.L., D2) of the main signal transmission section separately inputted to cancel the down-link signal distortion components and supply only the signal components U.L., D.L. to the output terminal 19.

The third delay element 9-3 is inserted in order to absorb the delay generated in the signal line from the bandpass filter 13-2 to the error amplifier 18-2.

Figure 15:
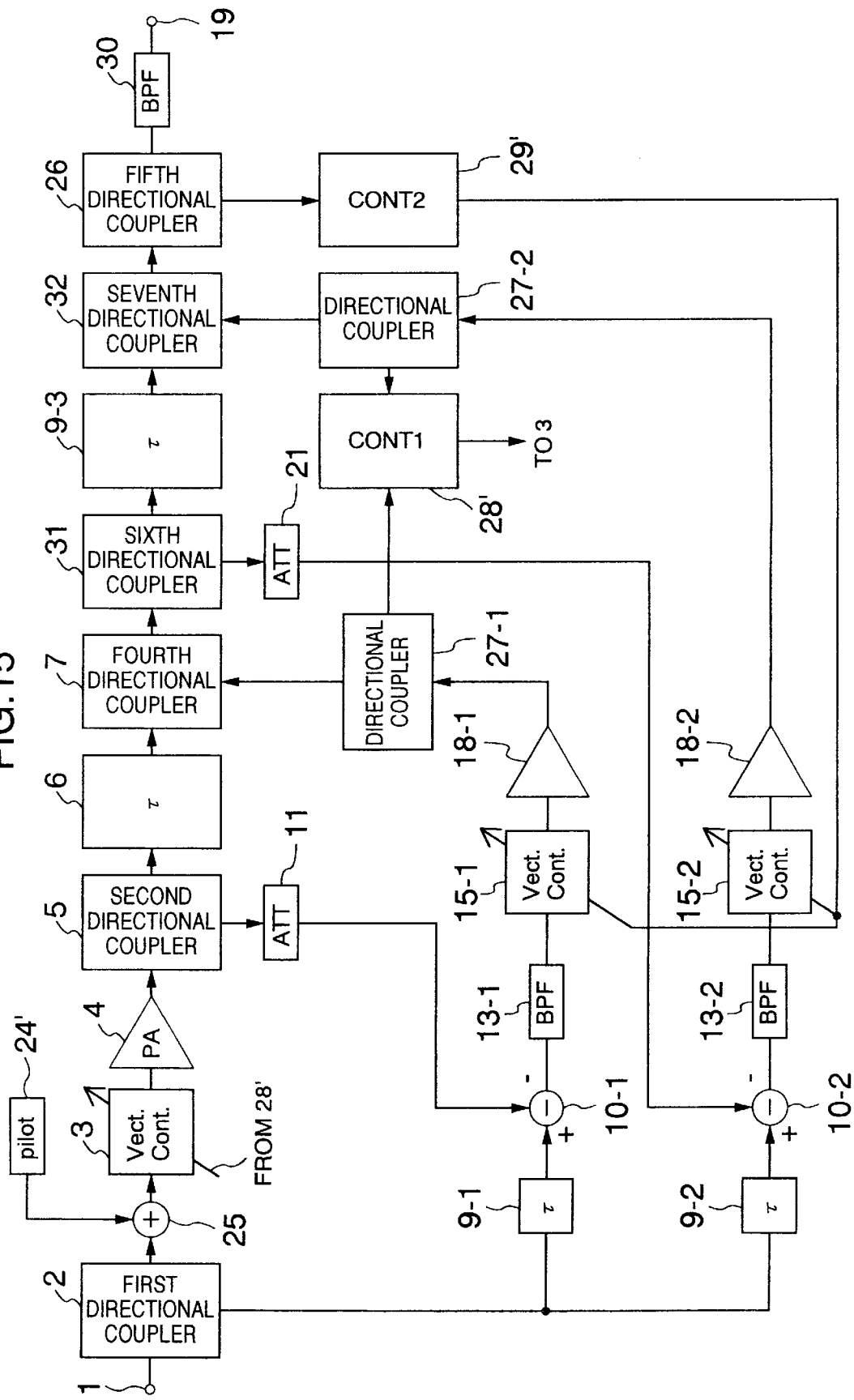
FIG. 15 is a block diagram showing a power amplifier according to a seventh embodiment of the present invention.

A seventh embodiment according to the present invention will be described with reference to FIG. 15. FIG. 15 is a block diagram showing a power amplifier according to the second embodiment of the present invention in which the sixth embodiment shown in FIG. 14 is given the function to adaptively control the level adjustment sections. In FIG. 15, reference numeral 24 designates a pilot signal generating section, 25 an adder, 26 a fifth directional coupler, 27-1, 27-2 third directional couplers, 28' a main signal controller, and 29' an error signal controller. The arrangement shown in FIG. 15 is substantially the same as that of FIG. 14 and includes the following elements and parts added thereto. Specifically, there are added the pilot signal generating section 24' and the adder 25. The adder 25 is provided between the first directional coupler 2 and the first vector adjustment section 3. The output from the pilot signal generating section 24' is connected to the adder 25. The third directional coupler 27-1 is provided in the signal line between the error amplifier 18-1 and the fourth directional coupler 7. Also, the third directional coupler 27-2 is provided in the signal line between the error amplifier 18-2 and the seventh directional coupler 32. The signal branched from the third directional coupler 27-1 is supplied to the main signal controller 28'. Also, the signal branched from the third directional coupler 27-2 is supplied to the main signal controller 28'. The output from the main signal controller 28' becomes the control signal to the first vector adjustment section 3. Further, in the signal line between the seventh directional coupler 32 and the output terminal 19, there are provided the fifth directional coupler 26 and the bandpass filter 30. The signal branched from the fifth directional coupler 26 is supplied to the error signal controller 29', and the output from the error signal controller 29' is supplied to the second vector adjustment sections 15-1, 15-2 as their control signal.

The signal outputted from the error amplifier 18-1 is supplied through the third directional coupler 27-1 to the fourth directional coupler 7. In addition, a part of the output signal is branched by the third directional coupler 27-1 and supplied to the main signal controller 28'. Further, in the signal line between the fourth directional coupler 7 and the output terminal 19, there are interposed the fifth directional coupler 26 and the band-pass filter 30. The fifth directional coupler 26 supplies the output signal of the seventh directional coupler 32 to the bandpass filter 30, and branches a part of the output signal and supplies the branched signal to the error signal controller 29'. The bandpass filter 30 cancels undesired frequency components plt1, plt2 of the signal inputted from the fifth directional coupler 26 and outputs a resultant signal to the output terminal 19.

An operation concerning the extraction/compensation of the distortion component shown in FIG. 15 is the same as that of the seventh embodiment shown in FIG. 14. However, since the seventh embodiment has no such function to adaptively effect the vector adjustment during the communication in actual practice, the seventh embodiment cannot follow the change of the surrounding circumstances and the aging change. In order to enable the power amplifier to operate stably relative to the change of the surrounding circumstances and the aging change, the first vector adjustment section 3 comprising the main signal-system line and the second vector adjustment sections 15-1, 15-2 of the distortion compensation-system line should be controlled during communication. In the embodiment shown in FIG. 15, the above-mentioned circuit elements may be controlled during communication as will be described below.

An operation of this embodiment will be described with reference to FIG. 11. FIG. 11 is a diagram showing an example of a signal spectrum obtained after the pilot signal was inserted with respect to the main signal and the distortion component according to the present invention.

The operation concerning the extraction/compensation of the distortion component is the same as that of the aforementioned sixth embodiment, and therefore need not be described.

As mentioned before, if the phase and the amplitude of the vector adjustment section 3 are controlled to be the optimum values, in the output from the subtracter 10-1, there is outputted only the up-link signal distortion component D1 generated in the line including the power amplifying section 4. However, when the phases or levels of the two signals inputted to the subtracter 10-1 are different from each other, the up-link signal U.L. and the down-link signal D.L. which are the main signal are not suppressed and left in the output from the subtracter 10-1. Therefore, by monitoring the electric power of the distortion compensation section following the output of the subtracter 10-1, it becomes possible to control the first vector adjustment section 3. Accordingly, in this embodiment, the up-link signal distortion component D1 which is the output of the error amplifier 18-1 is extracted by the third directional coupler 27-1 and the down-link signal distortion component D2 which is the output of the error amplifier 18-2 is extracted by the third directional coupler 27-1. These two signals are inputted to the main signal control section 28'. The main signal control section 28' controls the first vector adjustment section 3 in such a manner that the total of these two signals may be minimized. Accordingly, the main signal control section 28' is arranged in such that, in the arrangement shown in FIG. 5, the signals from the directional couplers 27-1, 27-2 through an adder (not shown) are inputted to the input terminal 131.

In FIG. 15, if the elements and parts except the first vector adjustment section 3 and the power amplifying section 4 are sufficiently wide in band in the distortion compensation band and have no distortion, then the control can be effected only by the output from the first attenuator 11. Also, if the adjustment of the second vector adjustment sections 15-1, 15-2 is made optimum, then the distortion components can be canceled out by the fourth directional coupler 7 or the seventh directional coupler 32. Thus, the electric power out of the band in the up-link/down-link bands is monitored, and the second vector adjustment sections 15-1, 15-2 are controlled by the error signal control section 29' in such a manner that its electric power becomes minimum. The arrangement of the error signal control unit 297 may be made similar to that of the embodiment shown in FIG. 4.

As a method of adaptively controlling the respective vector adjustment sections, it is possible to use the pilot signal similarly to the embodiment shown in FIG. 10. The control method using the pilot signal will be described with reference to FIGS. 15 and 11.

The pilot signals plt1, plt2 generated from the pilot signal generating section 24' are added to the signal from the directional coupler 2 by the adder 25. Since the pilot signals plt1, plt2 are inserted into the output signal from the directional coupler 2, the inserted signal is considered as a part of the distortion signal. Accordingly, if the adjustment by the first vector adjustment section 3 is optimum, the main signal is suppressed at the outputs of the subtracters 10-1 and 10-2. Then the main signal control unit 28' monitors and adjusts only the levels of the whole band of the signals at the subtracters. On the other hand, the error signal control unit 29' on the output side regards the point at which the levels of the pilot signals plt1, plt2 become minimum as an optimum point of the vector adjustment, and controls the second vector adjustment sections 15-1, 15-2. Thereafter, the pilot signals plt1, plt2 are eliminated by the bandpass filter 30 and then the transmission is effected.

Figure 16:
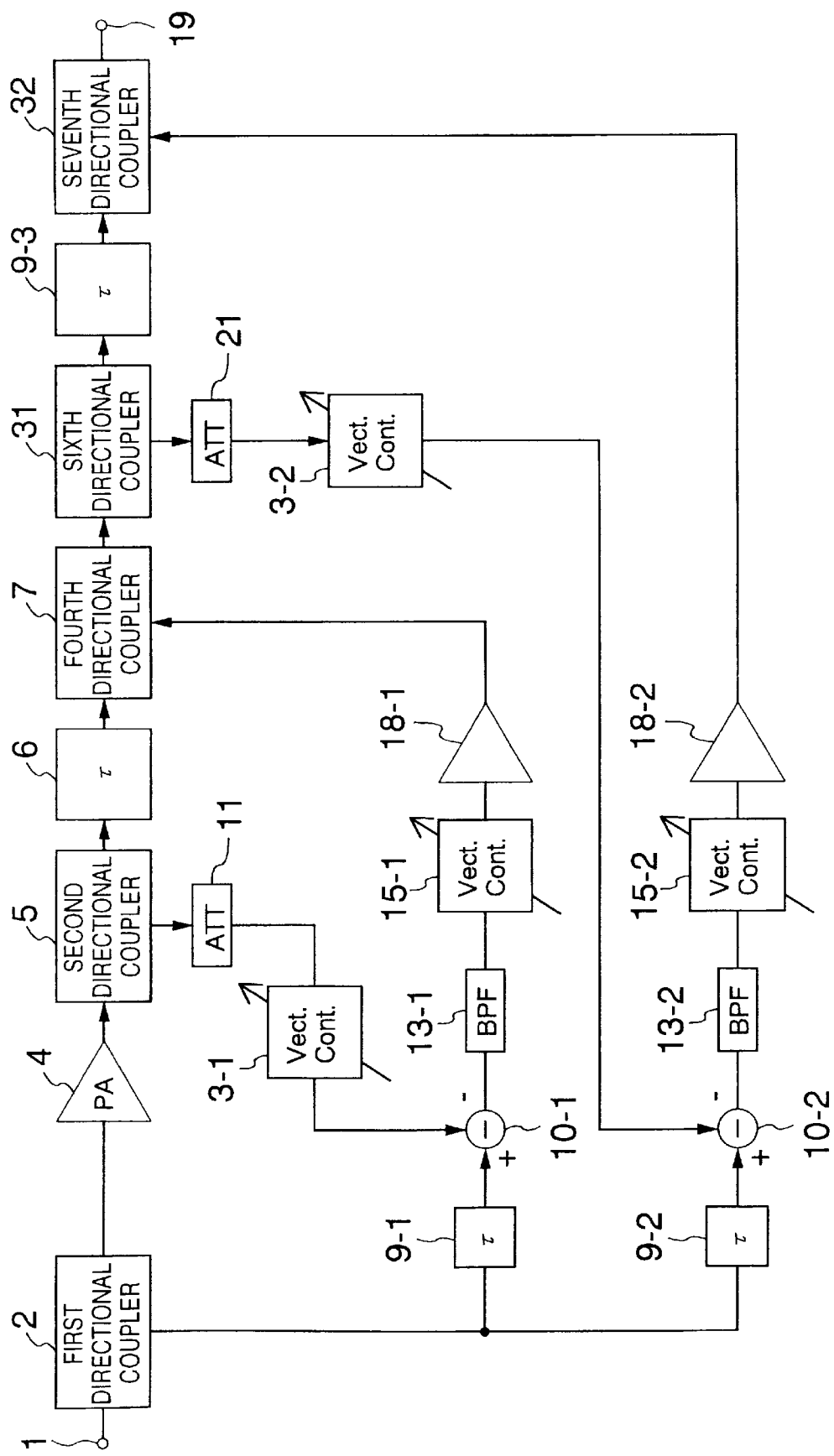
FIG. 16 is a block diagram showing a power amplifier according to an eighth embodiment of the present invention.

FIG. 16 shows an eighth embodiment according to the present invention. FIG. 16 is a block diagram used to explain the eighth embodiment of the present invention. The arrangement of FIG. 16 is substantially the same as that of the embodiment shown in FIG. 14 and has the following variations. That is, the first vector adjustment section 3 is deleted and the first directional coupler 2 and the power amplifying section 4 are connected directly. Instead, first vector adjustment sections 3-1, 3-2 are added. The first vector adjustment section 3-1 is interposed between the first attenuator 11 and the subtracter 10, and the first vector adjustment section 3-2 is interposed between the second attenuator 21 and the subtracter 10-2.

The block diagram shown in FIG. 16 is the modification of the arrangement of FIG. 14 in which the position of the first vector adjustment section is changed from the preceding stage of the power amplifying section 4 to the succeeding stage of the first attenuator 11 and the second attenuator 21. It is clear that the position of the vector adjustment section may be changed freely on the signal line.

Figure 2:
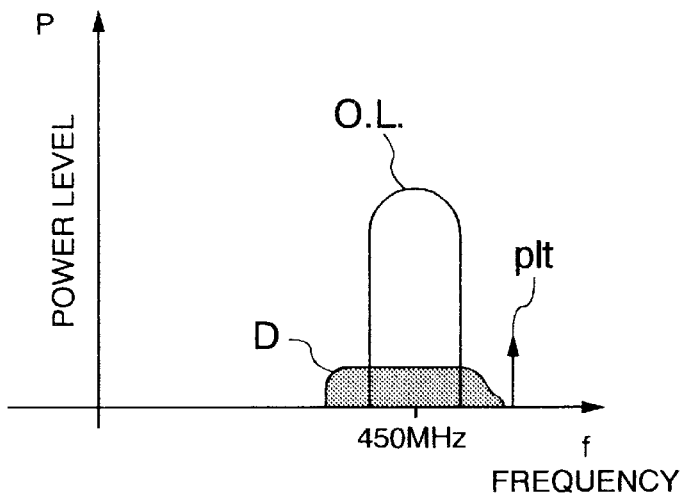
FIG. 2 is a diagram showing a relationship of respective frequencies of a transmission signal, a distortion component and a pilot signal in the conventional amplifier shown in FIG. 1.

Also, in the respective embodiments shown in FIGS. 14, 16, similarly to the embodiment shown in FIG. 2, by adaptively controlling the vector adjustment sections 3, 15-1, 15-2 with the main signal and error signal control sections 28', 29' or the like, it becomes possible to follow the change of the surrounding circumstances such as a temperature and the aging change.

While the power amplifier according to the present invention simultaneously amplifies the two signals having the different frequency bands as described above, the present invention is not limited thereto and may be applied to such a power amplifier in which more than three signals having different frequency bands are amplified simultaneously.

Figure 17:
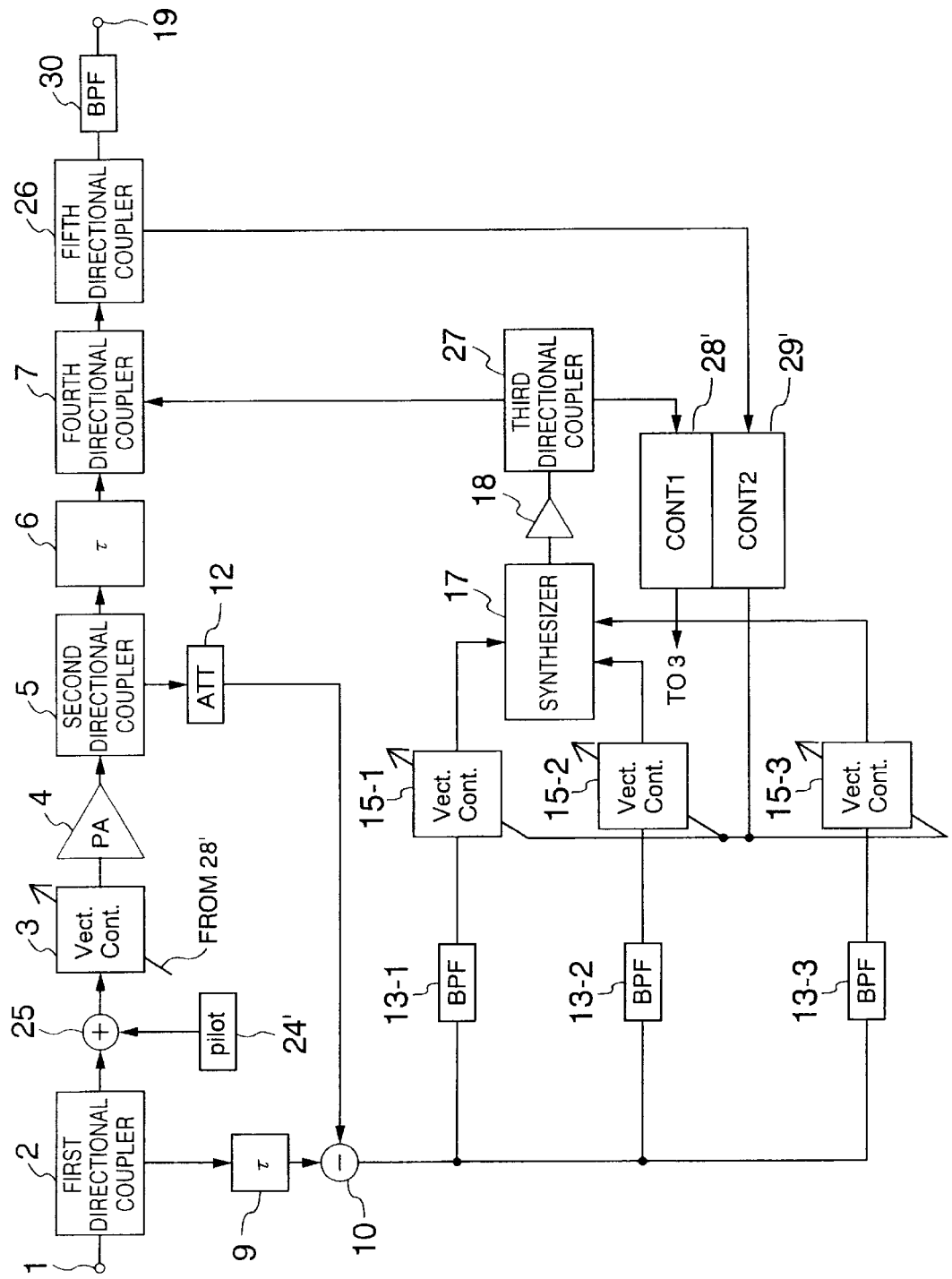
FIG. 17 is a block diagram showing a modified example of the power amplifier according to the third embodiment of the present invention.

FIG. 17 shows a modified example of the embodiment shown in FIG. 10 in which the three signals (first, second and third signals) having different frequency bands are amplified simultaneously.

In this embodiment, as shown in FIG. 17, there are provided a bandpass filter 13-1 having a passband of the third signal and a second vector adjustment section 15-3 for adjusting the phase and the level of the third signal. The phase and the level outputted from the second vector adjustment section 15-3 are controlled by the output from the error signal control section 29'. Also, a pilot signal generator 24' generates a pilot signal plt3 near the frequency band of the third signal in addition to the pilot signals plt1, plt2.

As described above, while the embodiments of the present invention are applied to the feedforward-system amplifier, the present invention is not limited thereto and may be applied to amplifiers of other systems such as a feedback-system amplifier.

As set forth above, according to an aspect of the present invention, there is provided an amplifier in which a plurality of input signals having different frequency bands are amplified simultaneously. This amplifier is comprised of:

an amplifying section (4) for simultaneously amplifying a plurality of input signals having different frequency bands;

a distortion extracting section (10, 13-1, 13-2, 14-1, 14-2) for separating and extracting distortion components at every one of the different frequency bands from a plurality of signals having different frequency bands outputted from the amplifying section 84);

a distortion compensation section (15-1, 15-2) for independently adjusting at every one of the different frequency bands phases and amplitudes of the distortion components separated and extracted at every one of the different frequency bands; and a distortion eliminating section (7, 32) for canceling out distortion components from a plurality of signals having the different frequency bands outputted from the amplifying section (4) based on the adjusted distortion component at every one of the different frequency bands, wherein the distortion compensation section independently adjusts at every one of the different frequency bands the phase and the amplitude of the distortion component separated and extracted at every different frequency bands in such a manner that the phase and amplitude agree with a phase and an amplitude of a distortion component contained in a plurality of signals having different frequency bands outputted from the amplifying section (4).

According to the present invention, when a plurality of frequency bands are commonly amplified by an amplifier of a wide band, since the distortion amount is extracted at every separated band and the optimum linearization is effected on the respective bands, the compensation in the wide specific band becomes possible equivalently, and hence it becomes possible to realize a communication device of high efficiency and high transmission quality.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. An amplifier for amplifying an input signal having different frequency bands, comprising:

an input terminal to which said input signal is supplied;

an amplifying section coupled with said input terminal for amplifying said input signal;

a distortion extracting section for separating and extracting distortion components at every one of said different frequency bands in said input signal in comparison between said input signal and the output of said amplifying section;

a distortion compensation section coupled with said distortion extracting section for adjusting respective phases and amplitudes of said distortion components separated and extracted at every one of said different frequency bands; and a distortion eliminating section coupled with said amplifying section for canceling out distortion components from said output of amplifying section based on said adjusted distortion component at every one of said different frequency bands, wherein said distortion compensation section adjusts at every one of said different frequency bands the phases and the amplitudes of the distortion component in such a manner that said phases and amplitudes agree with a phase and an amplitude of said output of said amplifying section.

2. An amplifier as claimed in claim 1, wherein said distortion extracting section includes extracting means for extracting distortion components in comparison between said input signal having different frequency bands supplied to said amplifying section and said output of said amplifying section and means for separating and outputting said distortion components at every one of said different frequency bands.

3. An amplifier as claimed in claim 1, wherein said distortion extracting section includes separating means for separating and outputting a plurality of signals having different frequency bands outputted from the output of said amplifying section and means for separately extracting at every one of said different frequency bands distortion components in comparison between said input signal and the outputs of said separating and outputting means.

4. An amplifier as claimed in claim 1, wherein said distortion extracting section includes separating means for separating and outputting a plurality of input signals having different frequency bands from said input signal and means for extracting at every one of said different frequency bands distortion components in comparison between the outputs of said separating means and the output of said amplifying section.

5. An amplifier according to claim 1, further comprising adjusting means coupled to said input terminal for adjusting phase and amplitude of of said input signal and means for controlling said adjusting means based on information concerning a power level of a distortion component extracted from said distortion extracting section.

6. An amplifier as claimed in claim 1, further comprising means for adjusting independently a phase and an amplitude of said distortion compensation section based on information of output signals from said distortion eliminating section.

7. An amplifier according to claim 1, further comprising pilot signal generating means for generating pilot signals at the portions near said different frequency bands and applying said generated pilot signals to said input signal, adjusting means coupled to said input terminal for adjusting phase and amplitude of said input signal to which said pilot signals are applied, means for controlling said adjusting means in response to the state of the pilot signal contained in the output of said distortion compensation section and means for adjusting independently at every one of said different frequency bands the phase and the amplitude of the output of said distortion compensation section in response to the state of the pilot signal contained in the output from said amplifying section.

8. An amplifying method for amplifying an input signal having different frequency bands, comprising the steps of:

(a) inputting said input signal to an input terminal;

(b) amplifying said input signal having said different frequency bands;

(c) separating and extracting distortion components at said every one of said different frequency bands in said input signal in comparison between said input signal and an output of an amplifying section;

(d) adjusting phases and amplitudes of the distortion components separated and extracted at said every one of said different frequency bands; and (e) canceling the distortion components of said output of said amplifying section based on said adjusted distortion component at every one of said different frequency bands;

wherein said step (d) adjusts at every one of said different frequency bands the phase and the amplitude of the distortion component separated and extracted at every one of said different frequency bands in such a manner that said phases and said amplitudes agree with a phase and an amplitude of said output of said amplifying section.

9. An amplifying method as claimed in claim 8, wherein said step (c) includes a step of extracting distortion components in comparison between said input signal and said output of said amplifying section and a step of separating and outputting said extracted distortion components at every one of said different frequency bands.

10. An amplifying method as claimed in claim 8, wherein said step (c) includes a step of separating and outputting a plurality of amplified signals having different frequency bands from said output of said amplifying section, and a step of extracting said distortion components in comparison between said input signal and the output signal of said amplifying section.

11. An amplifying method as claimed in claim 8, wherein said step (c) includes a step of separating and outputting a plurality of input signals having said different frequency bands from said input signal and a step of extracting at every one of said frequency bands distortion components in comparison between said separated and outputted signals from said input signals from said input signals and the output of said amplifying section.

12. An amplifying method according to claim 8, further comprising a step of adjusting phase and amplitude of said input signal based on information concerning an electric power level of said extracted distortion component.

13. An amplifying method as claimed in claim 8, wherein said step (d) adjusts at every one of said frequency bands the phase and the amplitude of said separated and extracted distortion component based on information of the signals obtained at said step (e).

14. An amplifying method according to claim 8, further comprising a step of generating pilot signals near said respective different frequency bands and adding said pilot signals to said input signal having said different frequency bands and a step of adjusting phases and amplitudes of said input signal having said different frequency bands with said pilot signals added thereto in response to the state of the pilot signal contained in said distortion components separated and extracted at every one of said different frequency bands, and wherein said step (d) includes a step of adjusting independently at said every different frequency bands the phase and the amplitude of the separated and extracted distortion component in response to the state of the pilot signal contained in said output of said amplifying section.

* * * * *